United States Patent
Ito et al.

(10) Patent No.: US 7,180,035 B2
(45) Date of Patent: Feb. 20, 2007

(54) SUBSTRATE PROCESSING DEVICE

(75) Inventors: Norihiro Ito, Tosu (JP); Hiroaki Kawaguchi, Tosu (JP); Yasuhiro Chouno, Tosu (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 10/519,126

(22) PCT Filed: Jun. 25, 2003

(86) PCT No.: PCT/JP03/08048

§ 371 (c)(1),
(2), (4) Date: Sep. 28, 2005

(87) PCT Pub. No.: WO04/001830

PCT Pub. Date: Dec. 31, 2003

(65) Prior Publication Data

US 2006/0110143 A1    May 25, 2006

(30) Foreign Application Priority Data

Jun. 25, 2002    (JP)    ............... 2002-184378

(51) Int. Cl.
*F22B 1/28*    (2006.01)
*H01L 21/303*    (2006.01)

(52) U.S. Cl. .................. 219/401; 219/390; 392/400; 134/902

(58) Field of Classification Search .............. None
See application file for complete search history.

(56) References Cited

U.S. PATENT DOCUMENTS

| | | | | |
|---|---|---|---|---|
| 4,186,032 A | * | 1/1980 | Ham | ............ 134/902 |
| 4,749,440 A | * | 6/1988 | Blackwood et al. | ........ 134/902 |
| 4,879,041 A | * | 11/1989 | Kurokawa et al. | .......... 210/640 |
| 5,063,609 A | | 11/1991 | Lorimer | |
| 5,105,556 A | * | 4/1992 | Kurokawa et al. | ............ 34/470 |
| 5,520,743 A | | 5/1996 | Takahashi | |

(Continued)

FOREIGN PATENT DOCUMENTS

JP    59-128733    8/1984

(Continued)

OTHER PUBLICATIONS

Partial machine translation of JP2000-091288, Cleaning Method of Semiconductor, Mar. 31, 2000, Hisashi et al.*

(Continued)

*Primary Examiner*—Joseph Pelham
(74) *Attorney, Agent, or Firm*—Morrison & Foerster LLP

(57) ABSTRACT

A steam generator 40' provided in a substrate processing apparatus includes a tank 301 having a hollow cylindrical member 302 formed of a composite of PTFE and PFA and a pair of side wall plates 303 connected to the opposite ends of the cylindrical member 302. The tank 301 is surrounded by a shell 305 of an aluminum alloy to prevent deformation of the tank due to internal pressure of the tank. A heater 308 is attached to the outer surfaces of the plate members 307 of the shell 305. The shell 305 restrains the tank 301 and compresses elastic sealing members 305 to sealingly engage the cylindrical member 302 and the side wall plate 303 with each other.

16 Claims, 18 Drawing Sheets

U.S. PATENT DOCUMENTS

| | | | | |
|---|---|---|---|---|
| 5,776,296 | A | * | 7/1998 | Matthews .................... 134/902 |
| 5,911,837 | A | * | 6/1999 | Matthews ....................... 134/2 |
| 5,940,985 | A | * | 8/1999 | Kamikawa et al. ............ 34/471 |
| 6,729,041 | B2 | * | 5/2004 | Shindo et al. ................. 34/218 |
| 6,817,370 | B2 | * | 11/2004 | Bergman et al. ............. 134/902 |
| 7,086,410 | B2 | * | 8/2006 | Chouno et al. ............... 137/14 |

FOREIGN PATENT DOCUMENTS

| | | |
|---|---|---|
| JP | 03-137401 | 6/1991 |
| JP | 06-084464 | 3/1994 |
| JP | 09-199472 | 7/1997 |
| JP | 09-251975 | 9/1997 |
| JP | 09-327669 | 12/1997 |
| JP | 10-055991 | 2/1998 |
| JP | 11-067717 | 3/1999 |
| JP | 2000-091288 | 3/2000 |
| JP | 2001-252550 | 9/2001 |
| JP | 2002-110611 | 4/2002 |

OTHER PUBLICATIONS

Partial machine translation of JP2001-252550, Apparatus for Supplying Steam, Sep. 18, 2001, Masahiro et al.*

* cited by examiner

SUBSTRATE PROCESSING DEVICE

TECHNICAL FIELD

The present invention relates to a substrate processing apparatus using steam for processing a substrate, such as a semiconductor wafer or a glass for an LCD substrate.

BACKGROUND ART

A series of steps of a semiconductor device fabricating process includes a step of removing a resist coated on a surface of a semiconductor wafer. A known resist removing method makes a resist water-soluble and washes it out with deionized water. A process for making the resist water-soluble uses a substrate processing apparatus, which holds the wafer in a processing chamber, and supplies a mixed process fluid of ozone gas and steam into the processing chamber to make the resist into water-soluble by oxidizing the resist with the mixed process fluid. The substrate processing apparatus is provided with a steam generator that heats deionized water stored in a tank to generate steam to be supplied into the processing chamber. Steam generated by heating the deionized water in the tank flows upward, is carried by a steam supply line connected to an upper part of the tank, is mixed with ozone gas, and is supplied into the processing chamber.

A problem in the conventional substrate processing apparatus is that a metal forming the walls of the tank of the steam generator dissolves in the deionized water, and the dissolved metal flowed together with steam into the processing chamber forms particles, and the particles contaminate the wafer.

It is possible that the mist of deionized water flowed together with steam into the processing chamber forms water marks on the wafer. Therefore, the tank of the conventional steam generator must contain deionized water such that the level of deionized water is kept below the level of the steam supply line to prevent the flow of the mist of deionized water into the steam supply line. Since a large space needs to be formed between the liquid level in the tank and the steam supply line, the dimensional reduction of the tank is limited.

A steam generator capable of solving the foregoing problem is disclosed in U.S. Pat. No. 5,063,609 to Lorimer (JP3-137401A is the Japanese equivalent). Lorimer's steam generator is provided with a tank formed of a material from which metals do not dissolve into deionized water, such as Teflon®, to avoid the contamination of a wafer with metals. To solve the problem resulting from the mist of deionized water, Lorimer's steam generator has a plurality of stacked tanks each internally provided with a coil heater coated with Teflon. However, Lorimer's steam generator has a complicated construction, is costly and requires troublesome maintenance work. The coil heater has a narrow surface in contact with a liquid and hence its heating efficiency is low. It is possible that the Teflon coating is subject to deterioration with time.

SUMMARY OF THE INVENTION

Accordingly, it is an object of the present invention to provide a substrate processing apparatus provided with a steam generator capable of supplying steam not contaminated with matters, such as metals, detrimental to processing a substrate into a processing chamber.

Another object of the present invention is to provide a substrate processing apparatus provided with a steam generator capable of avoiding supplying the mist of deionized water into a processing chamber.

Another object of the present invention is to provide a substrate processing apparatus provided with a steam generator capable of maintaining a stable performance for a long period of time.

Another object of the present invention is to provide a substrate processing apparatus provided with a steam generator of simple construction capable of achieving at least one of the foregoing objects.

With the foregoing objects in view, the present invention provides a substrate processing apparatus, which includes: a steam generator having a tank and at least one heater, and adapted to generate steam by heating deionized water contained in the tank to vaporize the deionized water with the heater; and a processing vessel adapted to process therein a substrate with steam generated by the steam generator, wherein the tank includes a hollow, tubular body arranged with the axis thereof extending horizontally and having opposite open ends, and a pair of plate members covering the opposite open ends of the tubular body to define an interior space of the tank together with the tubular body, the tubular body is formed of a resin material, and said at least one heater is disposed outside the interior space of the tank while contacting with or arranged adjacent to an outer surface of at least one of the plate members.

Preferably, the resin material forming the tubular body is such a material as will not release any matters detrimental to processing a substrate when exposed to an atmosphere of liquid deionized water and gaseous deionized water. Preferably, the resin material forming the tubular body is a fluorocarbon resin, such as PTFE or PFA. More desirably, the resin material forming the tubular body is a composite of PTFE and PFA having excellent creep resistance.

Preferably, the plate member contacting with or arranged adjacent to the heater is formed of a material having a thermal conductivity higher than that of the resin forming the tubular body, in view of heat transfer from the heater to deionized water contained in the tank. Suitable materials for the plate member having high heat conductivity include metals and amorphous carbon. If the plate member is formed of a metal, it is preferable to provide a coating layer of a resin material on the inner surface facing the interior of the tank in order to prevent the metal from dissolving in the deionized water.

Preferably, resin materials for forming the layer are those that will not release matters detrimental to processing a substrate into deionized water when exposed to an atmosphere of liquid-phase or gas-phase deionized water, namely, fluorocarbon resins such as PTFE and PFA. However, the coating layer may be omitted when the material forming the plate member is such a material that will release a negligibly small amount of matters detrimental to processing a substrate into deionized water when exposed to an atmosphere of liquid-phase or gas-phase deionized water, such as high-purity titanium.

In a preferred embodiment, the pair of plate members are formed of a material having a high thermal conductivity, and a pair of heaters are disposed while contacting with or arranged adjacent to the pair of plate members, respectively.

The substrate processing apparatus may further include a shell surrounding the tank to restrict the deformation of the tank due to the internal pressure of the tank. In this case, the heater may be held adjacent to the plate member on the shell. Preferably, the shell covers the tubular body of the tank formed of the resin material entirely in order to effectively prevent the deformation of the tank due to the creep of the resin material.

The heater may include a heat transfer block and a heating element provided at the heat transfer block. The upper edge of the heat transfer block may be located at a level corresponding to a set level of deionized water contained in the tank, and the heating element may be placed in a lower part of the heat transfer block.

Preferably, a deionized water supply line for supplying deionized water into the tank, a drain line for draining deionized water from the tank and a steam discharge line for discharging steam from the tank penetrate the tubular body formed of the resin material in order to prevent deionized water in a liquid phase or a gas phase from touching a metal. In this case, preferably, the deionized water supply line opens into the tank at a position below the set level of deionized water in the tank, the drain line opens into the tank at a position below the set level of deionized water in the tank, and the steam discharge line opens into the tank at a position above the set level of deionized water in the tank.

Preferably, at least one baffle plate is placed in the tank to prevent the mist of deionized water, which scatters without being vaporized, from reaching a steam outlet port of the tank. In a preferred embodiment, a plurality of vertically arranged baffle plates are provided as said at least one baffle plate, each of the baffle plates has at least one opening permitting steam to flow therethrough, the opening of the upper one of the two adjacent vertically arranged baffle plates does not overlap the opening of the lower one.

The substrate processing apparatus may further include a shell surrounding the tank to restrict the deformation of the tank due to the internal pressure of the tank. In a preferred embodiment, elastic sealing members are held between the tubular body of the tank and the plate members, respectively, and the tank and the shell are configured such that the shell presses the plate members against the tubular body and the elastic sealing members are compressed to seal the gaps between the tubular body and the plate members in an airtight and liquid-tight fashion when the tank is placed in the shell. Preferably, the tank and the shell are sized so that the plate members may not be in direct contact with the tubular body when the tank is placed in the shell and component parts of the tank are joined in an airtight and liquid-tight fashion.

Preferably, the interior space of the tank has a shape of a cylinder in general having a horizontal center axis. In this case, the cylinder is sized such that a bottom of the cylinder corresponding to a side of the tank has a diameter greater than a height of the cylinder corresponding to a horizontal width of the tank.

The substrate processing apparatus may further includes an ozone generator adapted to generate ozone gas. In this case, a mixed process fluid containing steam generated by the steam generator and ozone gas generated by the ozone generator is supplied into the processing vessel to process a substrate held in the processing vessel.

DESCRIPTION OF THE PREFERRED EMBODIMENTS

Figure 1:
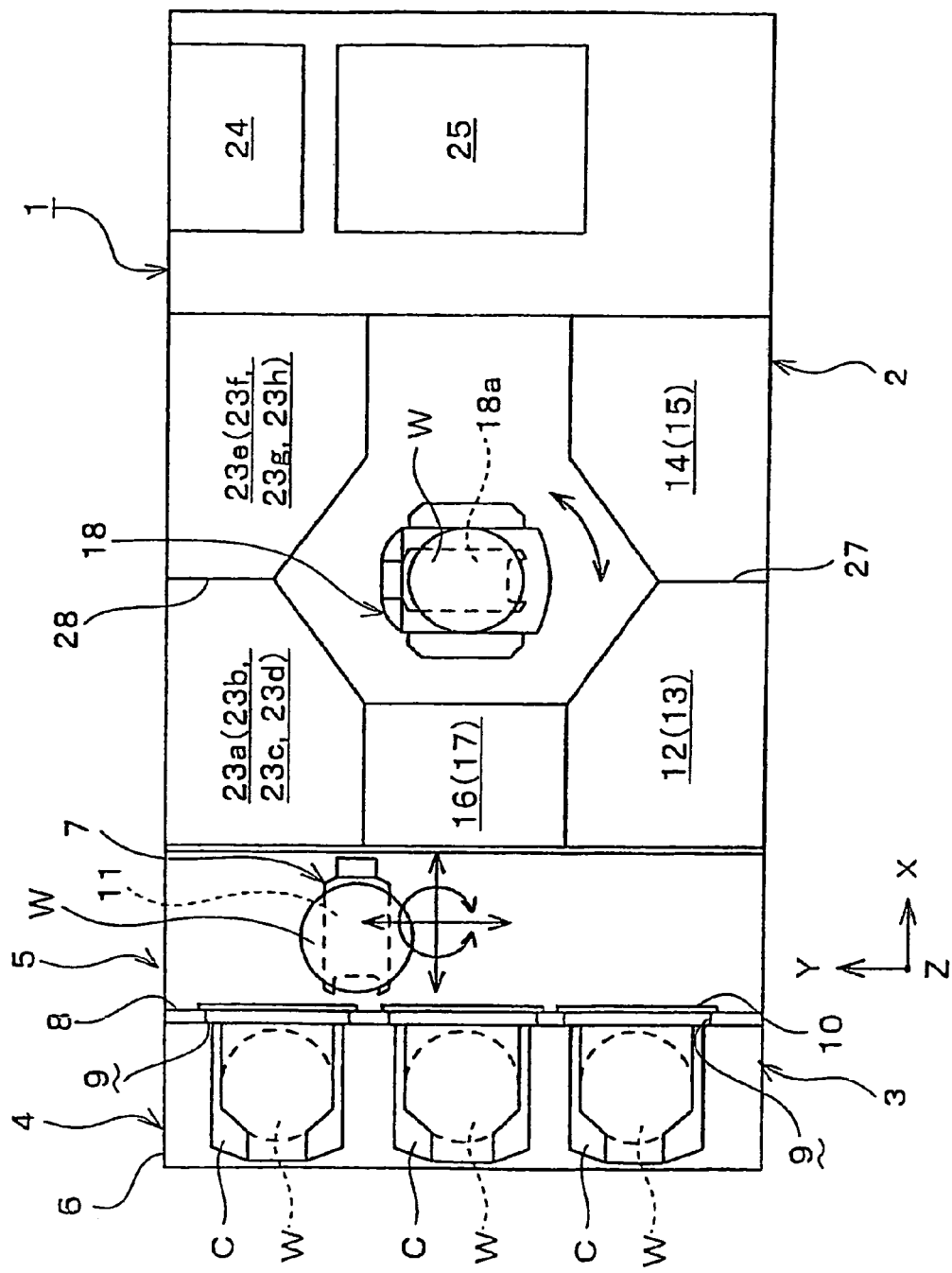
FIG. 1 is a schematic plan view of a processing system including a substrate processing apparatus according to the present invention.
Figure 2:
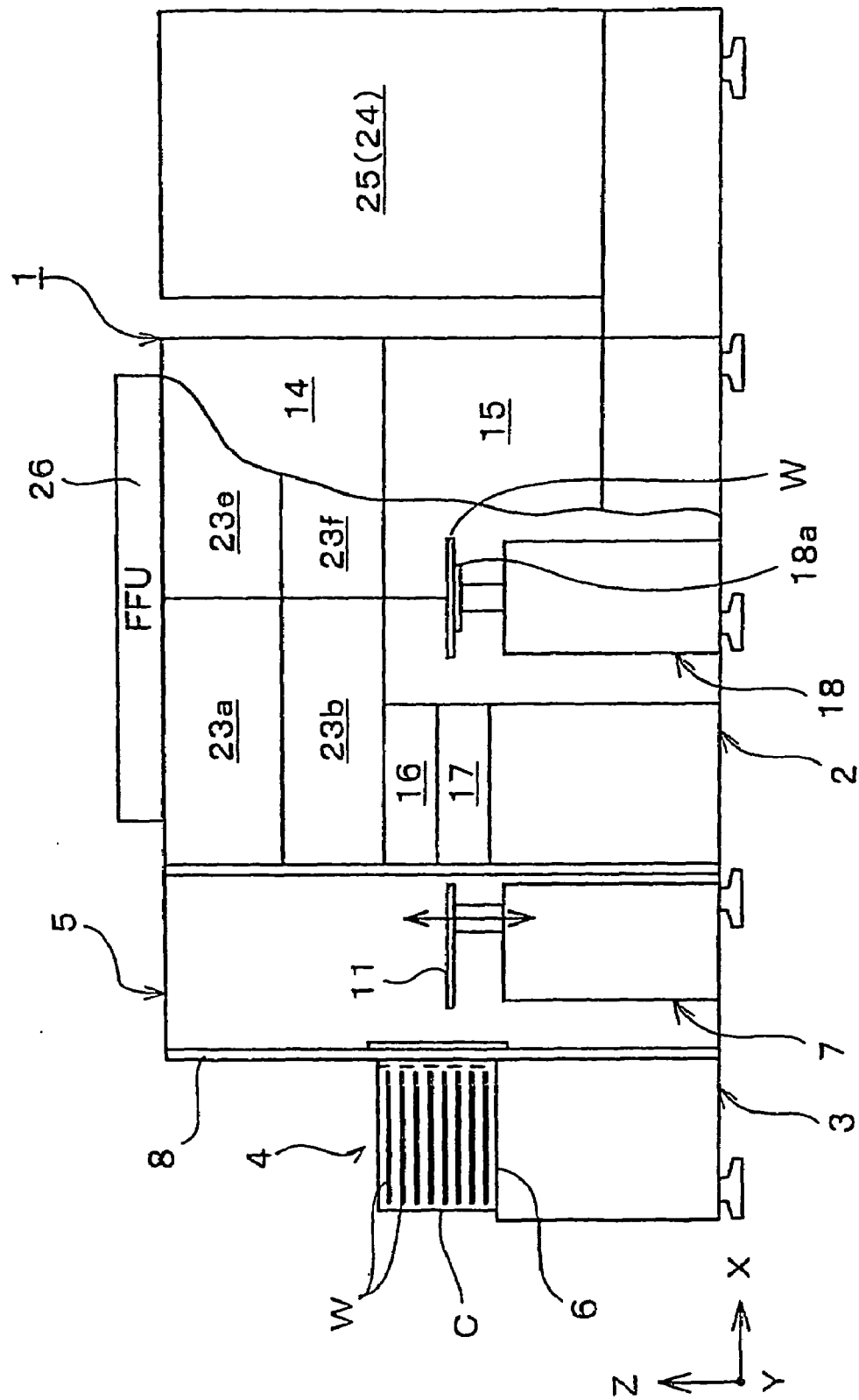
FIG. 2 is a schematic side elevation of the processing system shown in FIG. 1.

A preferred embodiment of the present invention will be described in terms of a substrate processing unit, as a substrate processing apparatus according to the present invention, as applied to making a resist applied to a surface of a wafer, as an example of a substrate, water-soluble. FIG. 1 is a plan view of a processing system 1 provided with substrate processing units 23a to 23h. FIG. 2 is a side elevation of the processing system 1. The processing system 1 has a processing section 2 for processing a wafer W by a cleaning process and a resist solubilizing process and a wafer carrying-in-out section 3 for carrying a wafer W into and carrying a wafer W from the processing section 2.

The wafer carrying-in-out section 3 includes: an in-out port 4 provided with a table 6 to support thereon carriers C each capable of holding a plurality of substantially disk-shaped wafers W, for example twenty-five wafers W in a substantially horizontal position at predetermined vertical intervals; and a wafer transfer section 5 provided with a wafer conveyer 7 for transferring a wafer W between the carrier C mounted on the table 6 and the processing section 2.

A wafer W is taken out from the carrier C and is inserted in the carrier C through one side of the carrier C provided with a lid capable of opening and closing. The inner wall surfaces of the carrier C are provided with shelves for supporting wafers W at predetermined intervals so as to define twenty-five slots for receiving wafers W. Each of the slots receives a wafer W with its major surface (i.e., a surface on which semiconductor devices are to be formed) facing up.

For example, three carriers C can be placed at predetermined positions on the table 6 of the in-out port 4 while being aligned along Y-directions on a horizontal plane. The carriers C are placed on the table while the side of each carrier C provided with the lid faces a partition wall 8 between the in-out port 4 and the wafer transfer section 5. Windows 9 are formed in the partition wall 8 so as to correspond to the positions where the carriers C are placed, respectively. Window-closing mechanisms 10 for closing the windows 9 by means of shutters or the like are placed on a surface of the partition wall 8 facing the wafer transfer section 5.

Each window closing mechanism 10 is capable of operating the lid of the carrier C for opening and closing the carrier C. The window closing mechanism 10 opens and closes the window 9 and the lid of the carrier C simultaneously. When the window 9 is opened and the open side of the carrier C is opened into the wafer transfer section 5, the wafer conveyer 7 of the wafer transfer section 5 is able to access the wafer W contained in the carrier C and to carry the wafer W.

The wafer conveyer 7 arranged in the wafer transfer section 5 is movable in Y-directions and Z-directions and is turnable in an X-Y plane (θ-directions). The wafer conveyer 7 has a wafer loading-unloading arm 11 capable of gripping a wafer W. The wafer loading-unloading arm 11 is slidable in directions along the X-axis. The wafer conveyer 7 is capable of accessing a wafer W held in a desired slot of the carrier C placed on the table 6, and is capable of accessing either of the two vertically stacked wafer transfer units 16 and 17 placed in the processing section 2 to carry a wafer from the in-out port 4 to the processing section 2 and to carry a wafer in reverse.

The processing section 2 includes a main wafer conveyer 18, namely, carrying means, the wafer transfer units 16 and 17, namely, relay units, four substrate cleaning units 12, 13, 14 and 15, and the substrate processing units 23a to 23h.

Installed in the processing section 2 are an ozone generator 24 for generating ozone to be supplied to the substrate processing units 23a to 23h, and a chemical solution storage unit 25 for storing processing liquids to be fed to the substrate cleaning units 12, 13, 14 and 15. A fan filter unit (FFU) 26 is incorporated into the ceiling of the processing section 2 to supply clean air in a down-flow mode into those units and the main wafer conveyer 18.

Part of the down-flowing air supplied from the FFU 26 flows through the wafer transfer units 16 and 17 and a space extending over the wafer transfer units 16 and 17 into the wafer transfer section 5. Thus, the penetration of particles and such from the wafer transfer section 5 into the processing section 2 is prevented to keep the processing section 2 at a desired level of cleanliness.

The wafer transfer units 16 and 17 hold temporarily a wafer W to be transferred to and from the wafer transfer section 5. The wafer transfer units 16 and 17 are stacked vertically at two levels. The lower wafer transfer unit 17 may be used for transferring a wafer from the in-out port 4 to the processing section 2, and the upper wafer transfer unit 16 may be used for transferring a wafer from the processing section 2 to the in-out port 4.

The main wafer conveyer 18 is able to move in X-directions and Z-directions and to turn in the X–Y plane (θ-directions). The main wafer conveyer 18 has a carrying arm 18a capable of holding a wafer W and of sliding in Y-directions. Thus, the main wafer conveyer 18 is capable of accessing the wafer transfer units 16 and 17, the substrate cleaning units 12 to 15 and all the substrate 35 processing units 23a to 23h.

Each of the substrate cleaning units 12, 13, 14 and 15 performs a cleaning process and a drying process to a wafer having been subjected to a resist solubilizing process in each of the substrate processing units 23a to 23h. The substrate cleaning units 12, 13, 14 and 15 are stacked up vertically at two levels in two columns; the two substrate cleaning units 12 and 14 are at the upper level and the two substrate cleaning units 13 and 15 are at the lower level. As shown in FIG. 1, the substrate processing units 12 to 15 are substantially the same in construction, except that the substrate cleaning units 12 and 13, and the substrate cleaning units 14 and 15 are symmetrical with respect to a partition wall 27.

The substrate processing units 23a to 23h perform the resist solubilizing process to a resist coated on a surface of a wafer W. As shown in FIG. 2, the substrate processing units 23a and 23h are stacked vertically at four levels in two columns. The substrate processing units 23d, 23c, 23b, and 23a are stacked up in that order in the left column, while the substrate processing units 23h, 23g, 23f and 23e are stacked up in that order in the right column. The substrate processing units 23a to 23h are substantially the same in construction, except that the substrate processing units 23a and 23e, the substrate processing units 23b and 23f, the substrate processing units 23c and 23g, and the substrate processing units 23d and 23h are symmetrical with respect to a partition wall 28 as shown in FIG. 1. The construction of the substrate processing units 23a and 23b will be described by way of example.

Figure 3:
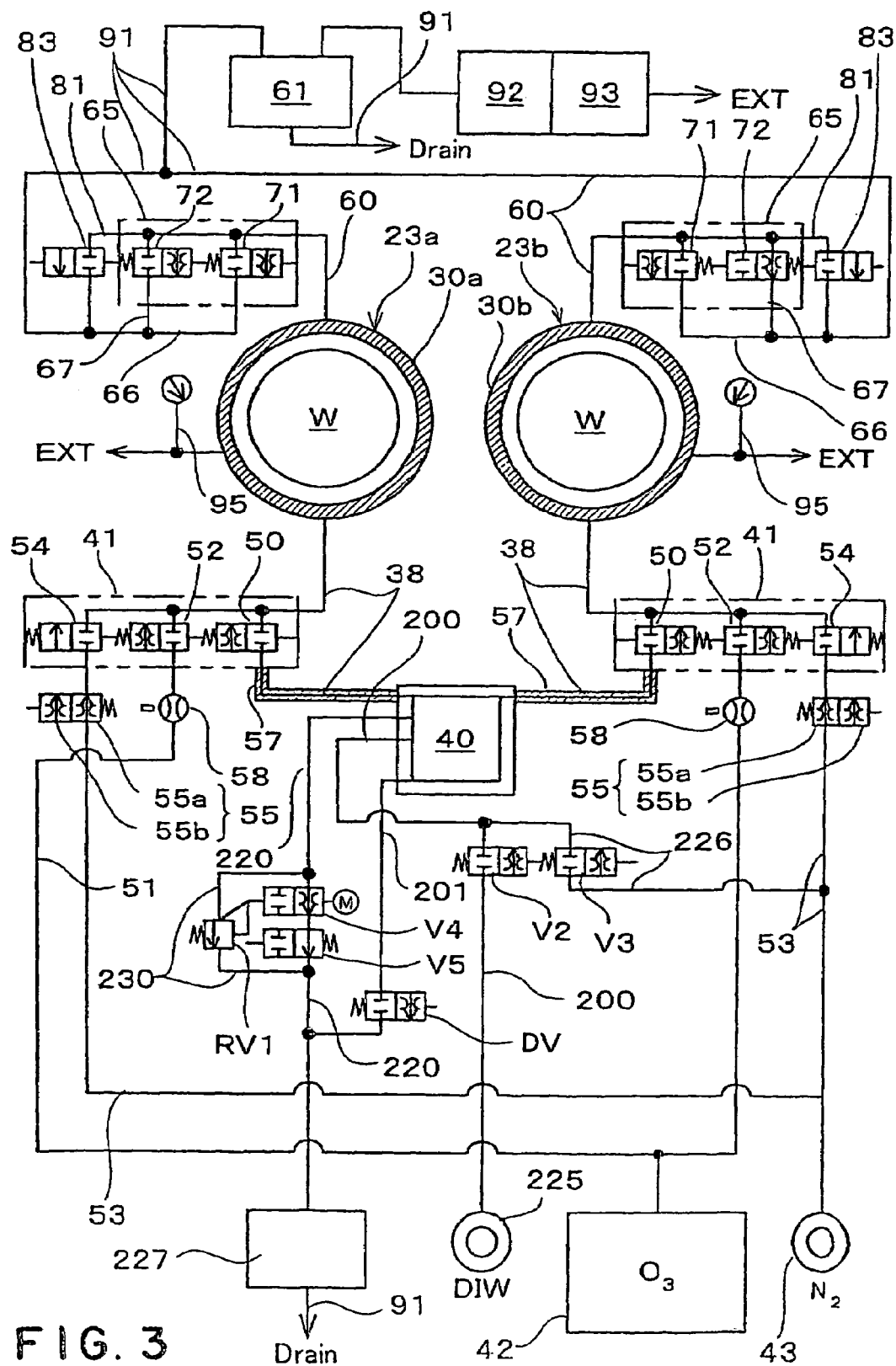
FIG. 3 is a piping diagram showing a piping system included in the substrate processing apparatus shown in FIG. 1.

Referring to FIG. 3 showing piping systems included in the substrate processing units 23a and 23b in a piping diagram, a steam generator 40, namely a single steam source, is connected to processing chambers (processing vessels) 30A and 30B included in the substrate processing units 23a and 23b by main steam supply pipes 38 (hereinafter, referred to as "main supply pipes 38"). An ozone generator 42 and a nitrogen gas source ($N_2$ source) 43 are connected to the main supply pipes 38 through supply selectors 41, respectively. Each supply selector 41 has a flow regulating valve 50 for opening and closing the main supply pipe 38 and for the flow control in the main supply pipe 38, a flow regulating valve 52 for opening and closing an ozone supply pipe 51 and for the flow control in the ozone supply pipe 51, and a selector valve 54 for opening and closing a $N_2$ supply pipe 53. Flow selector valves 55 are placed in the $N_2$ supply pipes 53, respectively. Each flow selector valve 55 has a high-flow passage 55a and a low-flow passage 55b which are connected selectively to the $N_2$ supply pipe 53.

The flow regulating valves 50 regulate the flow of steam generated by the steam generator 40 and flowing through the main supply pipes 38 so that the steam flows at the same flow rate through the main supply pipes 38 for well-balanced steam supply into the processing chambers 30A and 30B. The flow regulating valves 52 regulate the flow of ozone gas generated by the ozone generator 42 and flowing through the main supply pipes 38 so that ozone gas flows at the same flow rate through the ozone supply pipes 51 and the main supply pipes 38 into the processing chambers 30A and 30B. Each flow regulating valve 52 is provided with an adjustable restrictor for adjusting the flow rate of ozone gas. The flow selector valves 55 are adjusted so that $N_2$ gas is supplied at the same flow rate from the $N_2$ gas source 43 through the $N_2$ gas supply pipes 53 and the main supply pipes 38 into the processing chambers 30A and 30B.

A part of each main supply pipe 38 extending upstream of the flow regulating valve 50 is provided with a temperature regulator 57 having a tubular shape following the shape of the main supply pipe 38. The temperature regulator 57 regulates the temperature of steam flowing through the main supply pipe 38 to the flow regulating valve 50. A flow meter 58 is placed in part of each ozone supply pipe 51 extending upstream of the flow regulating valve 52.

Discharge pipes 60 are connected to parts of the processing chambers 30A and 30B opposite the parts of the same connected to the main supply pipes 38, respectively. The discharge pipes 60 are connected to a mist trap 61. Exhaust selectors 65, serving as pressure regulating means, are placed in the discharge pipes 60, respectively. Each exhaust selector 65 has a first discharge regulating valve 71 and a second discharge regulating valve 72. A branch pipe 66 and a branch pipe 67 are connected to the outlets of the first discharge regulating valve 71 and the second discharge regulating valve 72, respectively. The first discharge regulating valve 71 allows low-rate discharge when the same is opened. The second discharge regulating valve 72 allows high-rate discharge when the same is opened. At the downstream sides of the discharge regulating valves 72 and 73, the branch pipes 66 and 67 merge into a discharge pipe 60, which is connected to the mist trap 61. A part of the branch pipe 67 upstream of the second discharge regulating valve 72 is connected, through a branch pipe 81, to a part of the discharge pipe 91 downstream of the joint of the branch pipes 66 and 67. Placed in the branch pipe 81 is a third discharge regulating valve 83, which is closed under normal conditions, but opens in emergency, for example, when the pressures in the processing chambers 30A and 30B are excessively high.

The mist trap 61 cools a discharged process fluid to separate gases, which are contained in the discharged process fluid and contains ozone gas, from a liquid contained in the discharged process fluid, and drains the liquid through a drain pipe 91. An ozone killer 92 decomposes ozone gas contained in the separated gas into oxygen gas by thermal decomposition, and the separated gas is cooled by a gas cooler 93 and then is ejected.

As mentioned above, the flow regulating valves 50 control the flow of steam flowing into the processing chambers 30A and 30B, and the flow regulating valves 52 control the flow of ozone gas flowing into the processing chambers 30A and 30B. Pressures of steam, ozone gas or a mixed process fluid of steam and ozone gas in the processing chambers 30A and 30B are controlled through the control of discharge rates from the processing chambers 30A and 30B by the exhaust selectors 65.

Leakage sensors 95 are attached to the processing chambers 30A and 30B to monitor the processing chambers 30A and 30B for the leakage of the process fluid.

Figure 4:
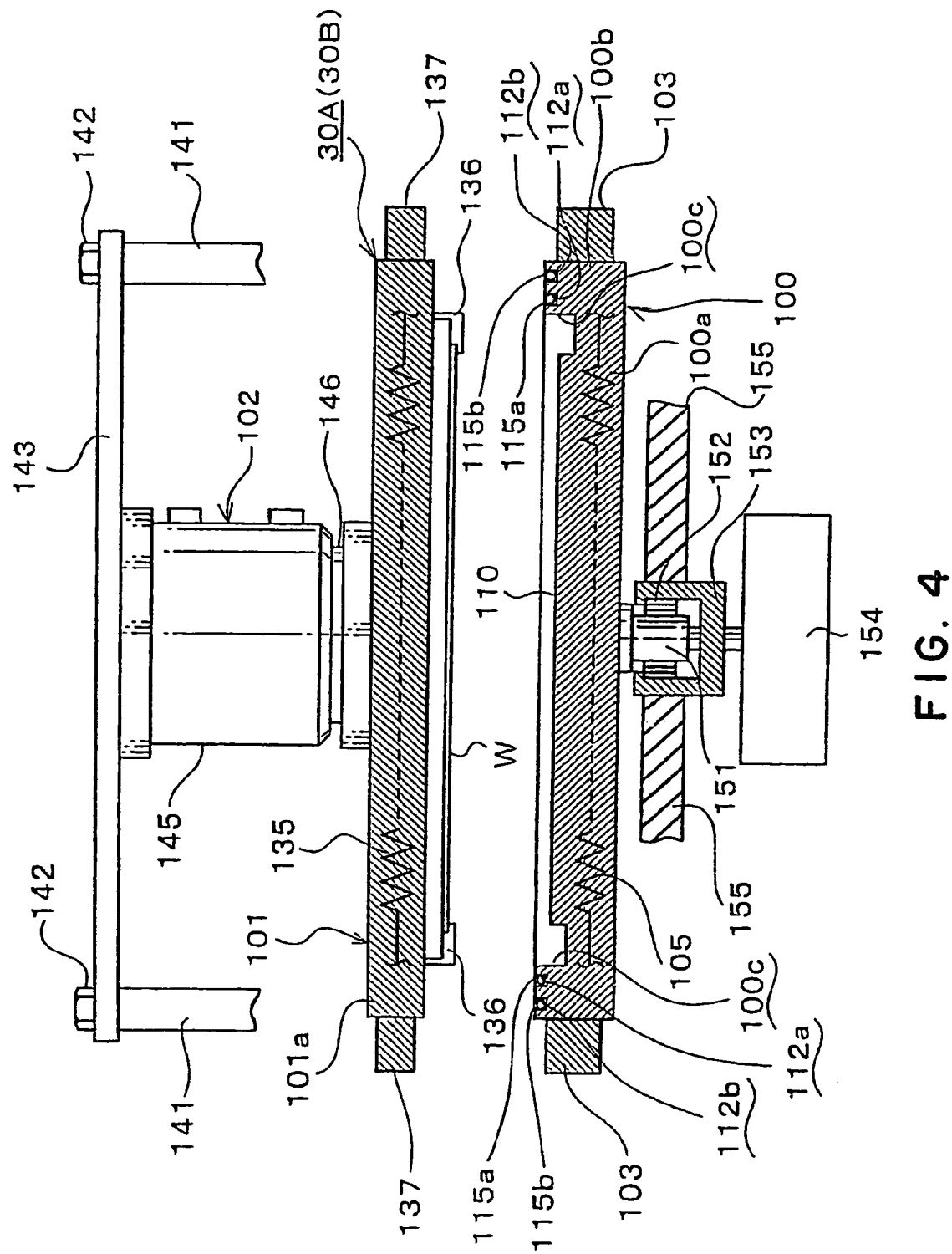
FIG. 4 is a longitudinal sectional view of a processing chamber included in the substrate processing apparatus shown in FIG. 3.
Figure 5:
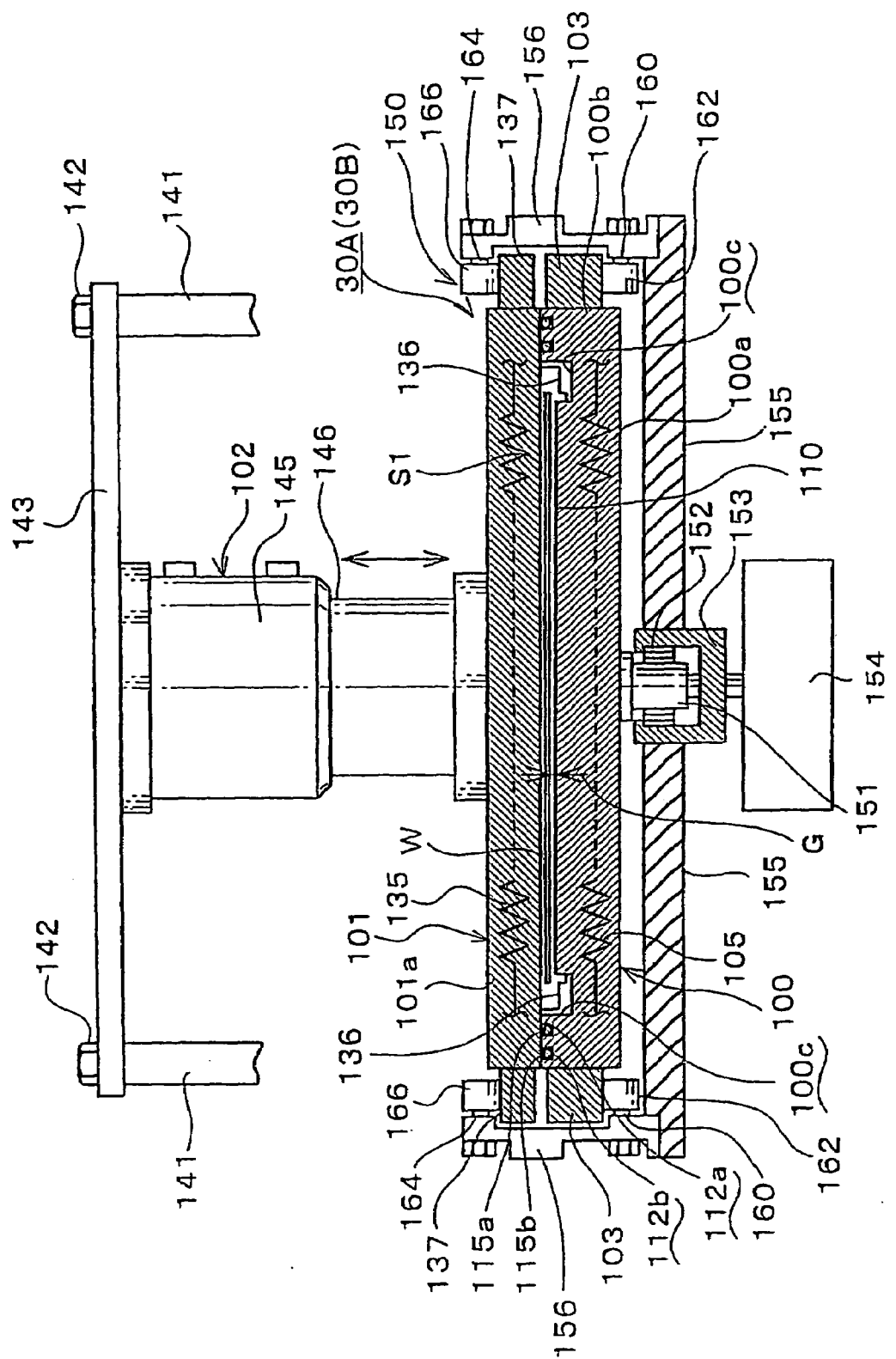
FIG. 5 is a longitudinal sectional view of the processing chamber shown in FIG. 4 in a sealed state.

Since the processing chambers 30A and 30B are the same in construction, only the processing chamber 30A will be described by way of example. Referring to FIG. 4, the processing chamber 30A is mainly composed of: a vessel body (chamber body) 100 for accommodating a wafer W; a lid 100 for receiving a wafer W from the main wafer conveyer 18 and transferring the wafer W to the vessel body 100; and a cylinder actuator 102 which is a moving means for separating the lid 101 from the vessel body 100 when the lid 101 receives a wafer W from the main wafer conveyer 18 and for joining the lid 101 close to the vessel body 100 when the wafer W is being processed. A sealed processing space S1 is formed as shown in FIG. 5 when the lid 101 is joined close to the vessel body 100.

The vessel body 100 has a disk-shaped base 100a and a circumferential wall 100b rising from the peripheral part of the base 100a. A circumferential lower engagement piece 103 is projected from the outer side surface of the base 100a. The lower engagement piece 103 engages with lower engagement rollers 162, which will be described later.

The base 100a is internally provided with a heater 105. A circular lower plate 110 of a diameter smaller than that of a wafer W rises from the upper surface of the base 100a. The upper surface of the lower plate 110 is located below a plane including the upper surface of the circumferential wall 100b. A groove 100c is formed between the circumferential wall 100b and the lower plate 110.

Figure 6:
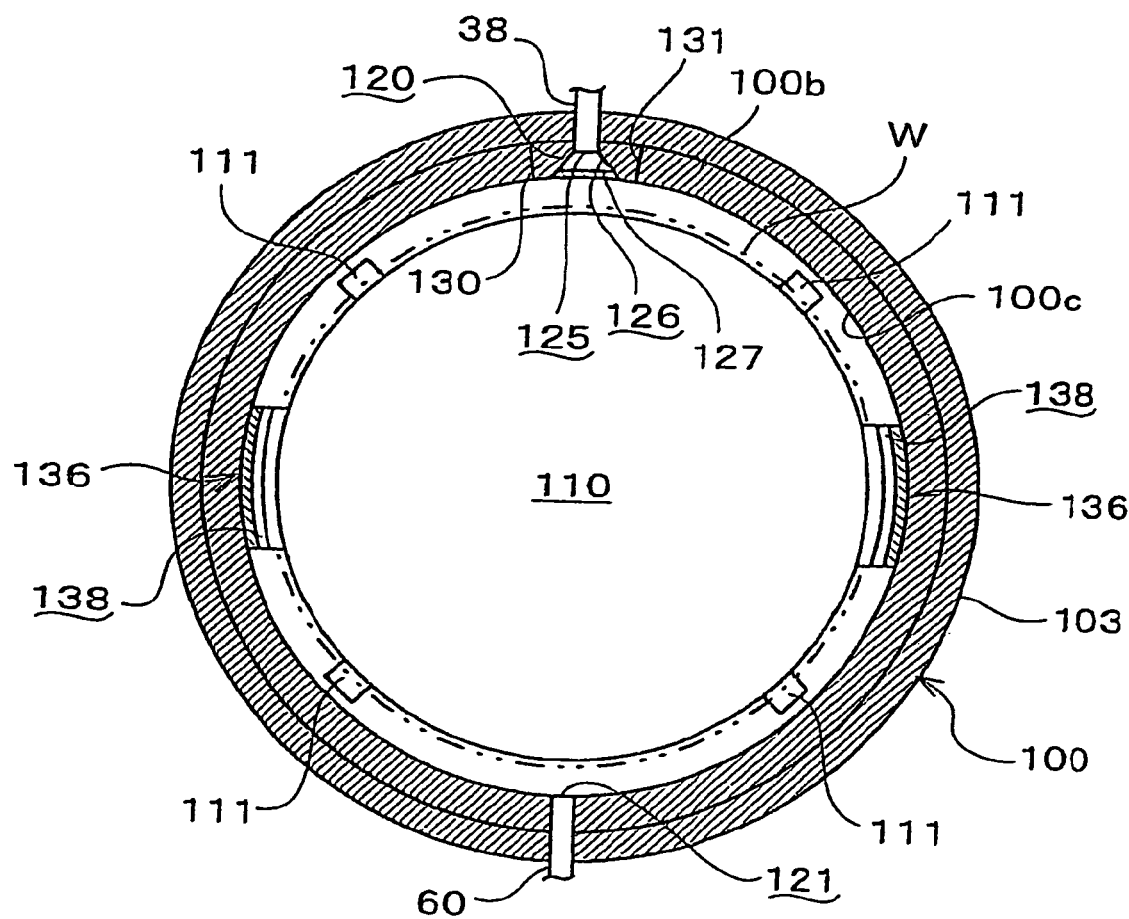
FIG. 6 is a cross-sectional view of a vessel body included in the processing chamber shown in FIG. 4.
Figure 7:
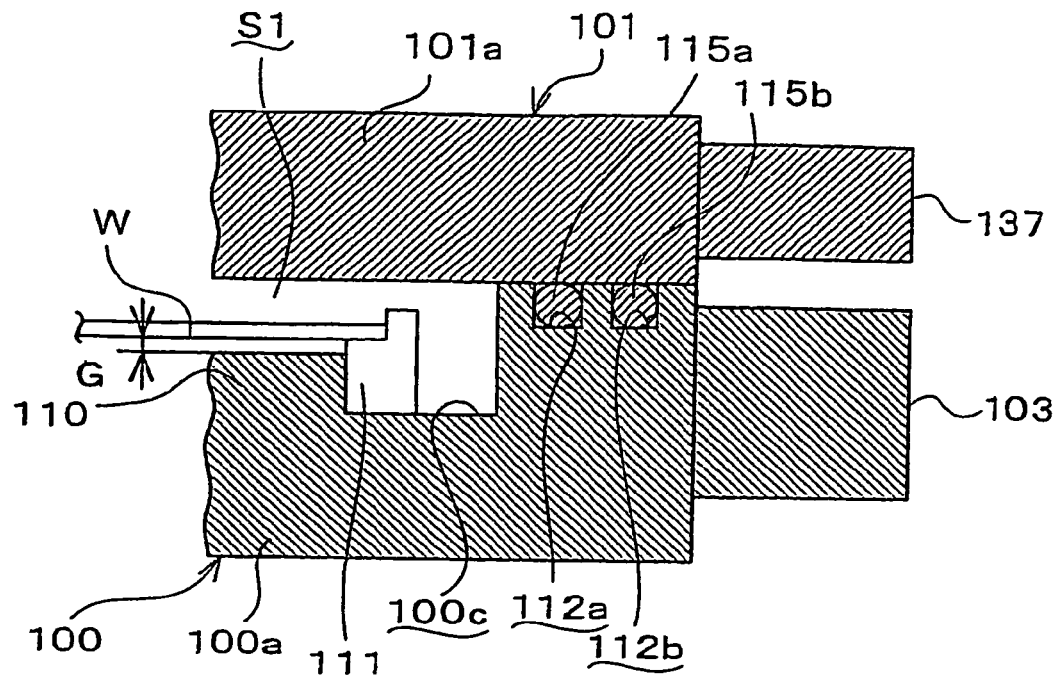
FIG. 7 is an enlarged, longitudinal sectional view of a support member placed in the vessel body of the processing chamber shown in FIG. 4.

Referring to FIG. 6, four support members 111, which contact four peripheral parts of the lower surface of a wafer W placed in the vessel body 100, are arranged around the lower plate 110. These four support members 111 support the wafer W stably at a receipt position. As shown in FIG. 7, a gap G of a thickness on the order of 1 mm is formed between the lower surface of a wafer supported by the support members 111 at the receipt position and the upper surface of the lower plate 110. The material forming the support members 111 is a resin, such as PTFE.

Referring to FIGS. 4 and 5, two concentric, annular grooves 112a and 112b are formed in the upper surface of the circumferential wall 100b, and O-rings 115a and 115b are fitted in the annular grooves 112a and 112b, respectively. Thereby, the processing space S1 can be sealed by joining the lower surface of the lid 101 close to the upper surface of the circumferential wall 100b.

A supply nozzle 120 is placed in the peripheral wall 110b as shown in FIG. 6 to supply the process fluid into the processing chamber 30A. A discharge port 121 is formed in the circumferential wall 100b diametrically opposite to the supply nozzle 120. The main supply pipe 38 is extended through the lower engagement piece 103 and is connected to the inlet part 125 of the supply nozzle 120. The discharge pipe 60 is extended through the lower engagement piece 103 and is connected to the discharge port 121.

Figure 8:
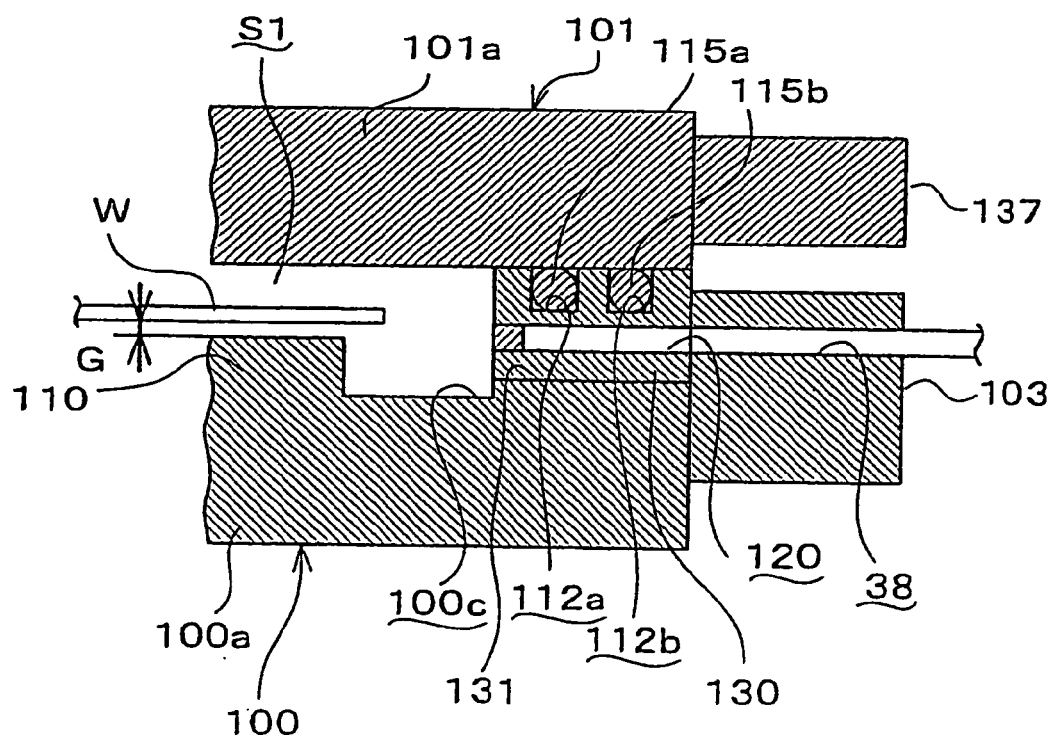
FIG. 8 is an enlarged, longitudinal sectional view of a supply nozzle combined with the vessel body of the processing chamber shown in FIG. 4.
Figure 9:
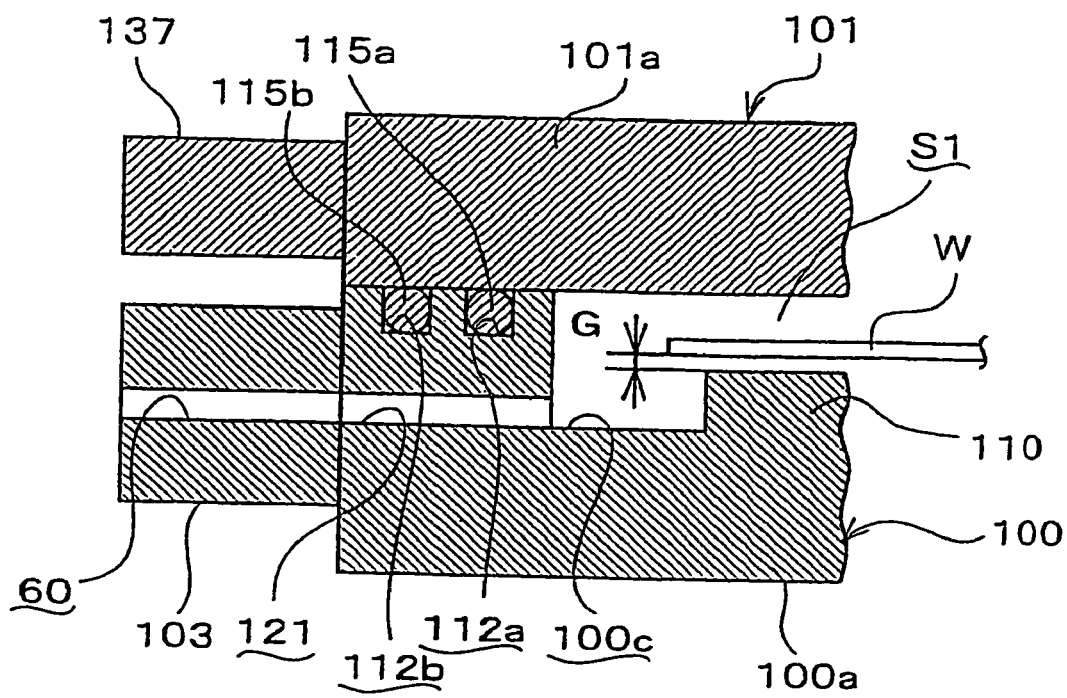
FIG. 9 is an enlarged, longitudinal sectional view of a discharge port formed in the vessel body of the processing chamber shown in FIG. 4.

The supply nozzle 120 opens into an upper part of the groove 100c as shown in FIG. 8. The discharge port 121 opens into a lower part of the groove 100c as shown in FIG. 9. Since the supply nozzle 120 is at a level above that of the discharge port 121, the process fluid can be smoothly supplied into the processing space S1 and the process fluid does not stagnate in the processing space S1. Furthermore, the process fluid may not remain at all in the processing chamber 30A when the process fluid is to be discharged from the processing space S1. As shown in FIG. 6, the supply nozzle 120 and the discharge port 121 are disposed at positions between the adjacent support members 111, respectively, so that the process fluid can be smoothly supplied into and discharged from the processing space S1 without being obstructed by the support members 111.

As shown in FIG. 6, the supply nozzle 120 has the inlet part 125 connected to the main supply pipe 38 to supply the process fluid through the circumferential wall 100b, and an outlet part 126 which horizontally fans out from the inlet part 125 toward the interior of the processing chamber 30A. A quartz porous mesh 127 is attached to the inner end of the outlet part 126. The process fluid carried by the main supply pipe 38 fans out through the outlet part 126, and flows through the porous mesh 127 into the processing chamber 30A. Since the outlet part 126 horizontally fans out, the process fluid can be efficiently diffused in the processing chamber 30A and, consequently, etching uniformity can be improved. Even if particles and the like are deposited in the groove 100, the process gas will not blow up particles and the like because the quartz mesh 127 reduces the velocity of the process fluid and hence adhesion of particles to the wafer W can be suppressed.

Figure 10:
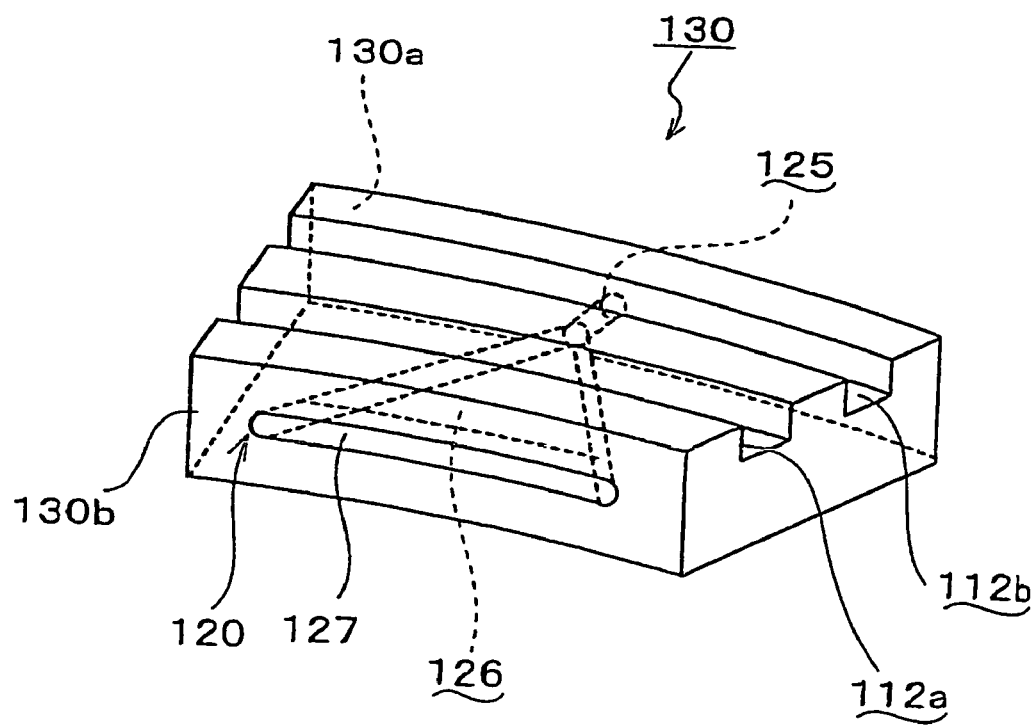
FIG. 10 is a perspective view of a supply nozzle holding part of the vessel body of the processing chamber shown in FIG. 4.

It is difficult to work the circumferential wall 100b to form the supply nozzle 120 because the lower plate 110 is formed inside the circumferential wall 100b of the vessel body 100e and hence a machining tool cannot be passed through the circumferential wall 100b. A part of the circumferential wall 100b in which the supply nozzle 120 is to be formed is cut out, and the cut out part is worked to form the supply nozzle 120. A nozzle forming segment 130 having a convex surface 130a and a concave surface 130b as shown in FIG. 10 is cut out from the circumferential wall 100b by cutting the circumferential wall 100b along two radial planes radially extending from the center of the vessel body 100 and a plane substantially parallel to and at a predetermined depth from the upper surface of the circumferential wall 100b. The inlet part 125 is formed in the nozzle forming segment 130 by machining the nozzle forming segment 130 from the side of the convex surface 130a. The outlet part 126 is formed by machining the nozzle forming segment 130 from the side of the concave surface 130b. Then the quartz mesh 127 is fitted in the open end of the outlet part 126. Then, the nozzle forming segment 130 thus provided with the supply nozzle 120 is fitted in a recess 131 which is formed in the circumferential wall 100b when the nozzle forming segment 130 is cut out, and the nozzle forming segment 130 is welded to the circumferential wall 100b. The nozzle forming segment 130 can be accurately welded to the circumferential wall 100b by electron beam welding. Thus the supply nozzle 120 can be formed.

Referring to FIG. 4, the lid 101 is composed of a lid body 101a internally provided with a heater 135, and two holding members 136 disposed diametrically opposite to each other in peripheral parts of the lower surface of the lid body 101a. Twelve upper engagement pieces 137 radially project from the outer circumference of the lid body 101a as shown in FIG. 13.

Figure 11:
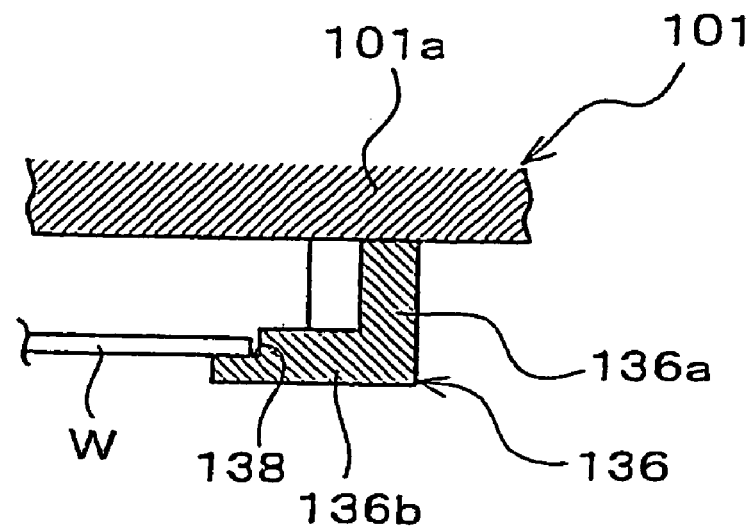
FIG. 11 is an enlarged, longitudinal sectional view of a holding member included in a cover for the processing chamber shown in FIG. 4.
Figure 12:
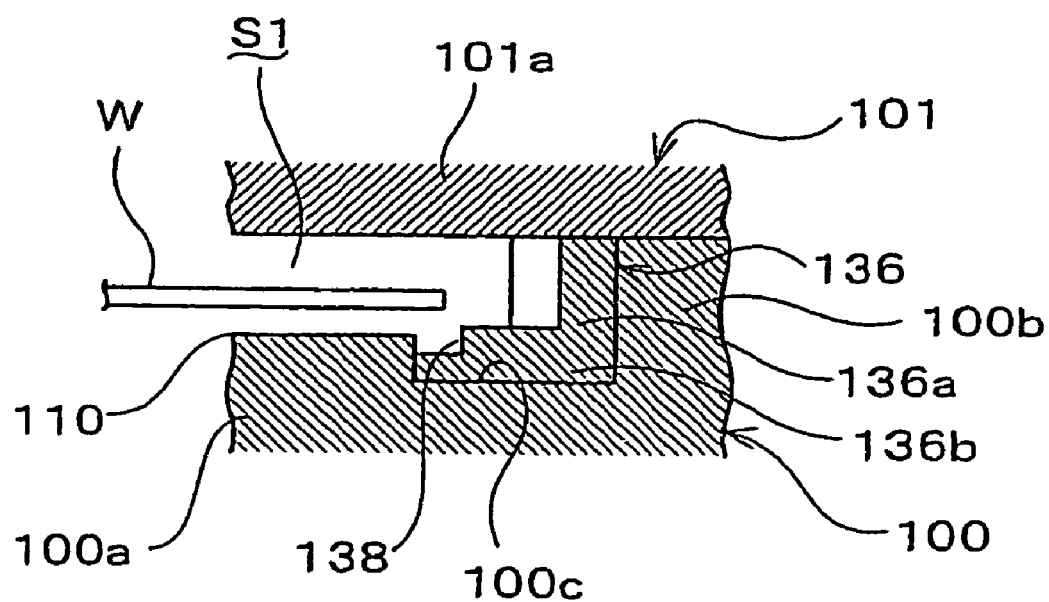
FIG. 12 is an enlarged, longitudinal sectional view of the holding member shown in FIG. 11 placed in a groove formed in the vessel body.

Referring to FIG. 11, the holding member 136 is substantially L-shaped, and has a vertical part 136a and a horizontal part 136 bent radially inward from the lower end of the vertical part 136a. The tip portion, namely the inner end portion, of the horizontal part 136 has a round face 137. The upper face of the tip portion of the horizontal part 136 has a step 138 on which an edge part of a wafer W is seated. When the cylinder actuator 102 is driven to move the lid 101 downwardly, the lid moves toward the vessel body 100, thereby the holding members 136 are received in the circular groove 100c of the vessel body 100 as shown in FIG. 12, and, consequently, a wafer W is transferred from the holding members 136 to the support members 111 of the vessel body 100.

Figure 13:
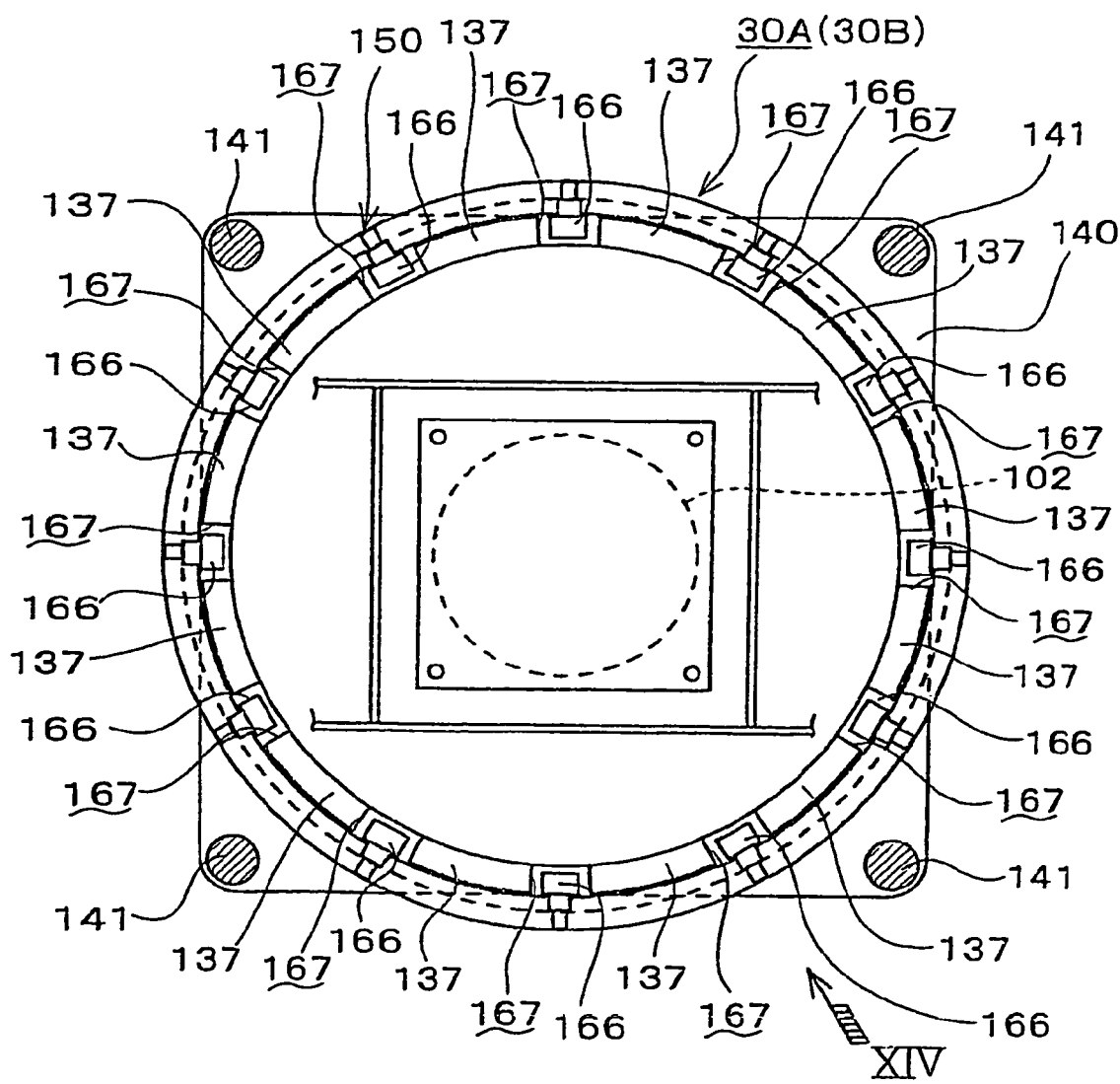
FIG. 13 is a plan view of a locking mechanism included in the processing chamber shown in FIG. 4.

The cylinder actuator 102, namely, a moving means, is composed of: a cylinder body 145 fastened to the lower surface of a top plate 143 fastened with bolts 142 to the upper ends of four columns 141 set up on a rectangular bed 140 as shown in FIG. 13; and a piston rod 146 projecting axially slidably from the lower end of the cylinder body 145 and fixedly connected to the upper surface of the lid 101 as shown in FIG. 4. Thus, when the piston rod 146 is retracted, the lid moves upward away from the vessel body 100. When the piston rod 146 is projected, the lid 101 moves downward toward the vessel body 100, and, eventually, the lid 101 is pressed against the upper surface of the circumferential wall 100b of the vessel body 100 so as to compress the O-rings 115a and 115b to seal the vessel body 100.

Referring to FIG. 5, a locking mechanism 150 includes: a rotating cylinder 153 rotatably supported, via a bearing 152, to a support shaft 151 projecting from the lower surface of the central part of the lower surface of the base 100a of the vessel body 100; a rotary actuator 154 for turning the rotating cylinder 153 in opposite directions in a horizontal plane; a disk 155 extending horizontally from the outer surface of the rotating cylinder 153. The locking mechanism 150 further includes: twelve brackets 156 set up on peripheral parts of the disk 155; lower engagement rollers 162 rotatably supported on lower horizontal shafts 160 projecting radially inward from lower parts of the brackets 156, respectively, so as to engage with the lower surface of the lower engagement piece 103; and upper engagement rollers 166 rotatably supported on upper horizontal shafts 164 projecting radially inward from upper parts of the brackets 156 so as to engage with the upper surfaces of the upper engagement pieces 137, respectively.

As shown in FIG. 13, the upper engagement pieces 137 arranged along the outer circumference of the lid 101 to project therefrom, while cut-outs 167 having a size slightly greater than the diameter of upper engagement rollers 166 are arranged between the upper engagement pieces 137.

Figure 14:
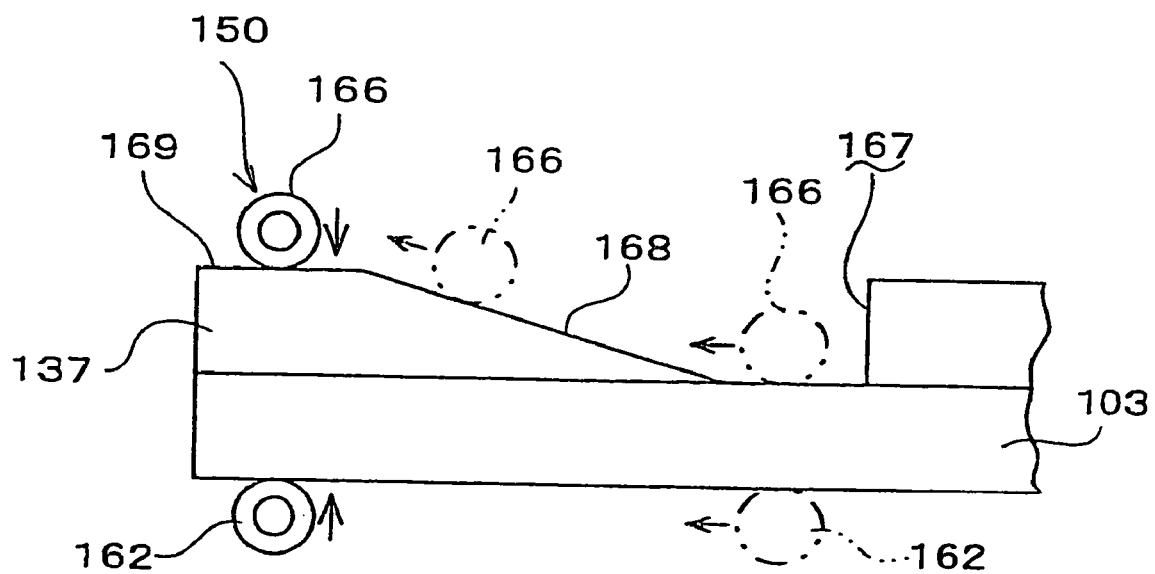
FIG. 14 is an enlarged view taken in the direction of the arrow XIV in FIG. 13.

As shown in FIG. 14, an inclined face 168 sloping up from one end (in FIG. 14, from the left side) of the cut-out 167 and a flat face 169 connected to the upper end of the inclined face 168 are formed in the upper surface of the projection 137.

Due to the provision of the locking mechanism 150 having the above structure, when the rotary actuator 154 is driven to turn the rotating cylinder 153 and the disk 155 with the lid 101 contacting the vessel body 100, the lower engagement rollers 126 roll along the lower surface of the lower engagement piece 103, and the upper engagement rollers 166 roll up the inclined faces 168 of the upper surfaces of the upper engagement pieces 137 to reach the flat faces 169. Thus, the twelve pairs of lower engagement rollers 162 and the upper engagement rollers 166 press the lower engagement piece 103 projecting from the base 100a of the vessel body 100 and the upper engagement pieces 137 projecting from the lid 101 toward each other in order to fasten (lock) the lid 101 to the vessel body 100. Since the O-rings 115a and 115b are thus compressed, the lid 101 is sealingly engaged with the vessel body 100.

The unlocking operation is performed by reversing the disk 155 by the rotary actuator 154 to move the lower engagement rollers 162 and the upper engagement rollers 166 to their standby positions in which the upper engagement rollers 166 are in the cut-outs 167.

Figure 15:
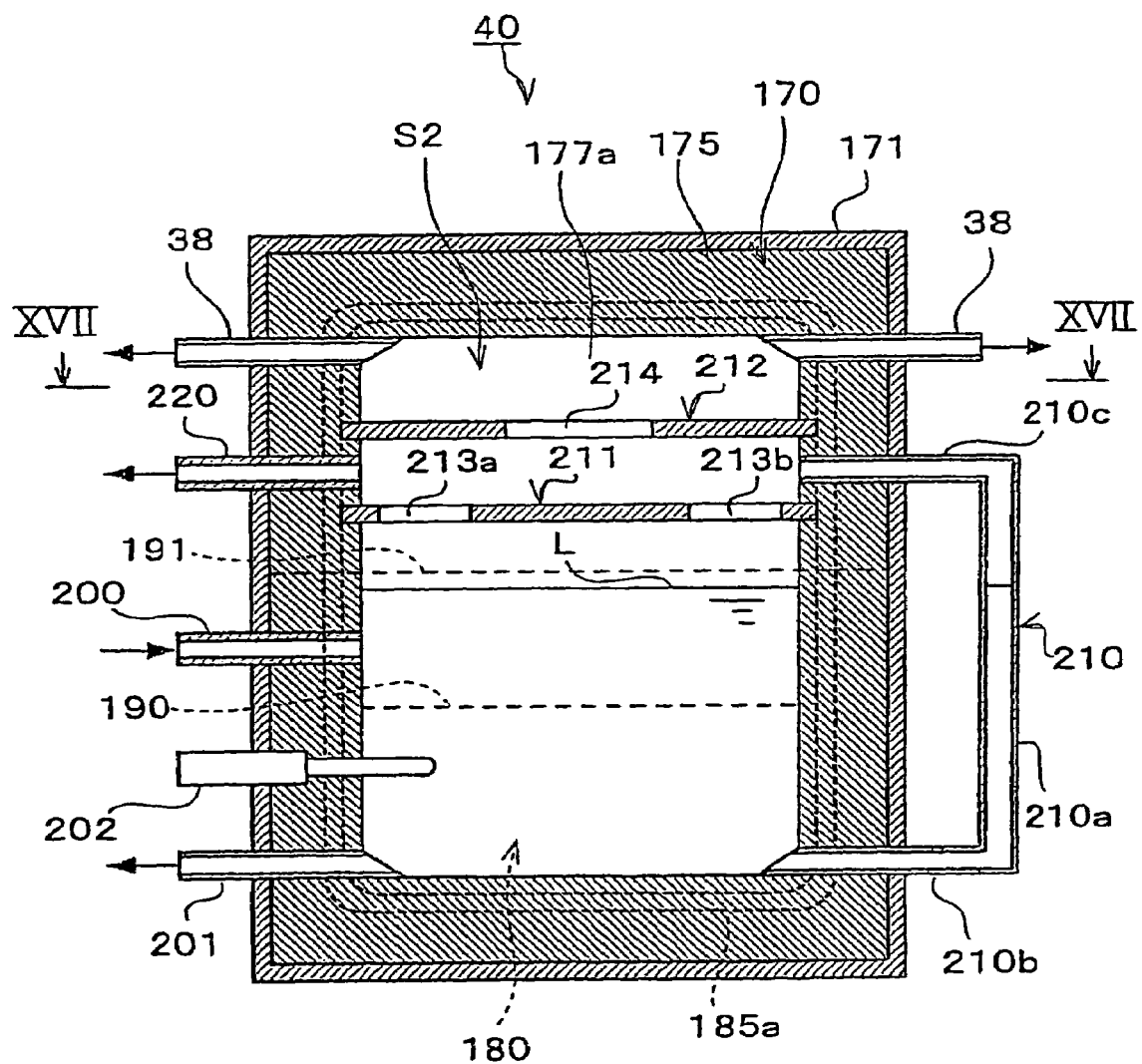
FIG. 15 is a longitudinal sectional view of a steam generator included in the substrate processing apparatus shown in FIG. 3.
Figure 16:
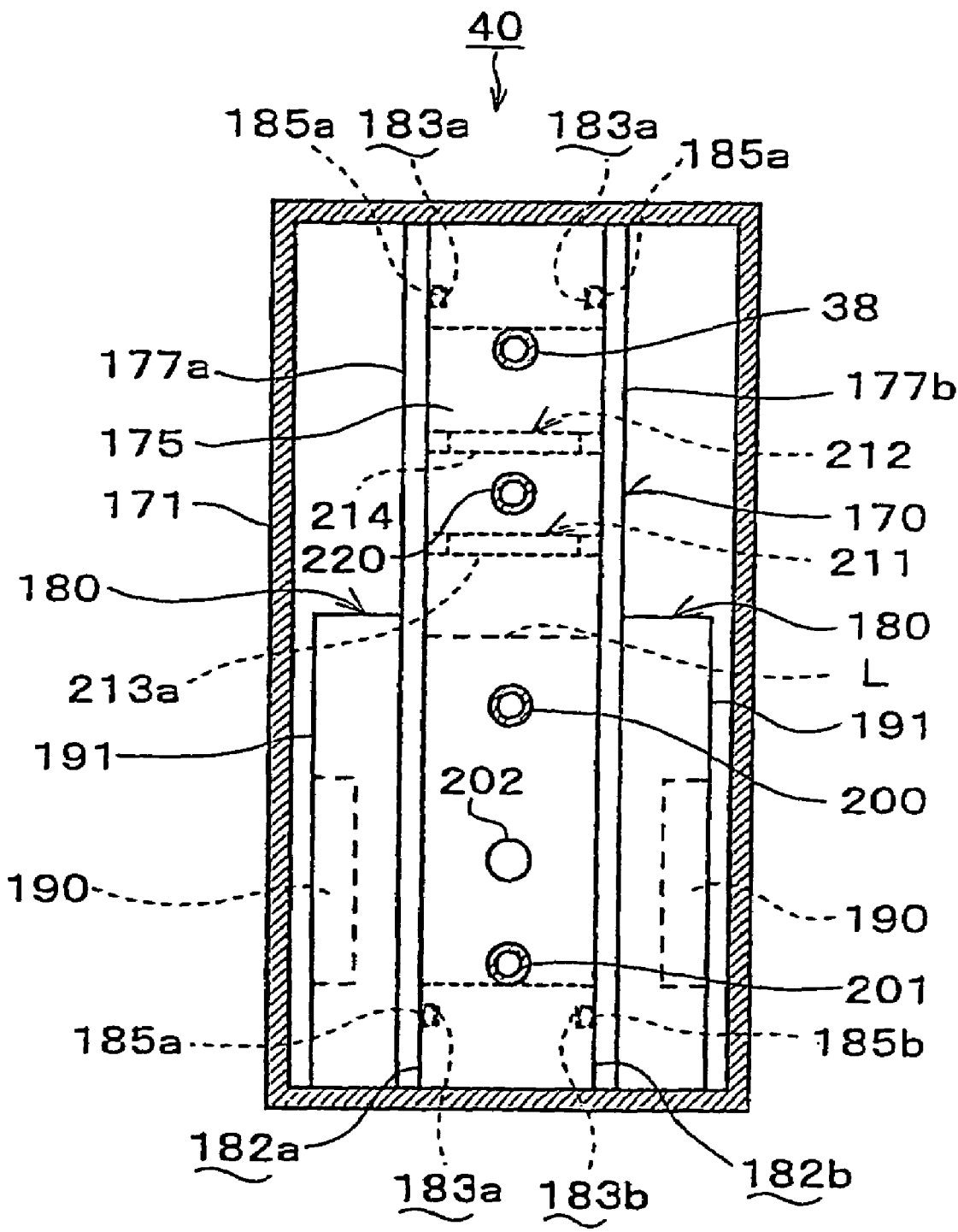
FIG. 16 is a longitudinal sectional view of the steam generator shown in FIG. 15.

Next, the steam generator 40 will be described. Referring to FIG. 15, the steam generator 40 includes a tank 170 for containing deionized water and a tank holding member 171 for fixedly holding the tank 170. As shown in FIG. 16, the tank 170 has a tubular body 175 having open opposite ends, and a pair of side wall plates 177*a* and 177*b* closing the opposite ends of the tubular body 175. Heaters 180 are disposed on the outer side of the side wall plates 177*a* and 177*b*, respectively. Deionized water is contained in a space S2 surrounded by the tubular body 175 and the side wall plates 177*a* and 177*b* and is heated through the side wall plates 177*a* and 177*b* by the heaters 180. The temperature in the tank 170 is controlled at about 120° C. while heated by the heaters 180, and steam is maintained in pressurized state. Deionized water in the tank 180 is effectively heated by the sides of the side wall plates 177*a* and 177*b* by the heaters 180. The tank 170 has a sealed, pressure-proof construction.

Figure 17:
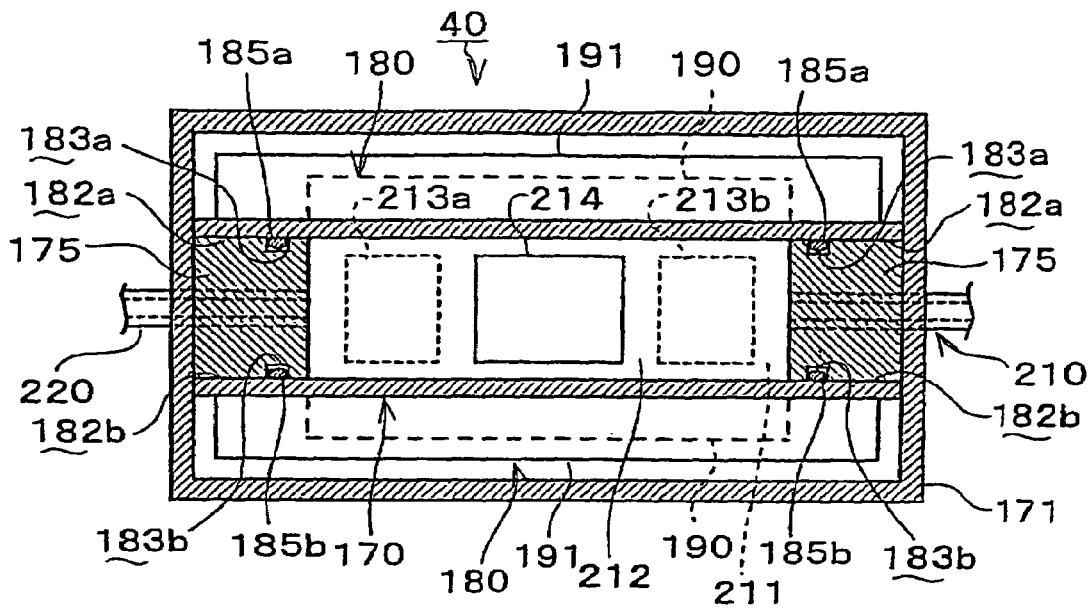
FIG. 17 is a sectional view taken on the line XVII—XVII in FIG. 15.

The tubular body 175 has an inner surface having a shape substantially resembling a quadrangular prism having rounded corners. The side wall plates 177*a* and 177*b* contact the annular end surfaces 182*a* and 182*b* of the tubular body 175. Bolt holes (not shown) are formed in the tubular body 175 and the side wall plates 177*a* and 177*b* so as to surround the tank inner space S2. Bolts are inserted into the bolt holes of the tubular body 175 and the side wall plates 177*b* from the side of the side wall plate 177*a*, and nuts are screwed on the bolts on the side of the side wall plate 177*b*, thereby the side wall plates 177*a* and 177*b* are fixed to the tubular body 175. As shown in FIGS. 16 and 17, annular grooves 183*a* and 183*b* are formed in the opposite end surfaces 182*a* and 182*b* of the tubular body 175, and O-rings 185*a* and 185*b* are interposed between the annular groove 183*a* and the side wall plate 177*a* and between the annular groove 183*b* and the side wall plate 177*b*. Thus, the side wall plates 177*a* and 177*b* sealingly contact the end surfaces 182*a* and 182*b*.

The material forming the tubular body 175 is a composite of PFA (perfluroethylene alkoxyalkane) and PTFE (polytetrafluoloethylene). The material forming the side wall plates 177*a* and 177*b* is high-purity titanium. The tank 170 is heat-resistant and vapor-resistant, and has a pressure-proof structure. "Metal elution," which is a phenomenon of dissolving ion of a metal in deionized water when exposed to an atmosphere of either of a liquid-phase deionized water or gas-phase deionized water, does not occur with PTFE or a composite of PEA and PTFE. Metal elution of high-purity titanium is minimal as compared with stainless steels. Therefore, very little metal elution occurs when the wall surfaces of the tank 170 are exposed to deionized water. Even if deionized water containing a very small amount of a metal is dissolved from liquid-contacting surfaces into deionized water to penetrate into the chamber 30A, adhesion of particles and contamination scarcely occur, and thus the processing of-the wafer W will not be adversely affected. The O-rings 185*a* and 185*b* are formed of a fluororubber, which is heat-resistant and vapor-resistant, and from which dissolving of a metal into deionized water does not occur.

The use of the composite of PFA and PTFE for forming the tank 170 prevents creeping and thus faulty sealing. It is effective in preventing the tank 170 from creeping that the distance between the end surfaces 182*a* and 182*b* of the tubular body 175 is reduced as far as possible.

As shown in FIG. 16, heaters 180 have heat generating devices 190 and heat transfer members 191 of a metal, such as aluminum, which transfer heat generated by the heat generating devices 190 to the side wall plates 177*a* and 177*b*, respectively. The heat transfer members 191 are in contact with the outer surfaces of the side wall plates 177*a* and 177*b*, respectively. The upper edges of the heat transfer members 191 horizontally extend at the level of the liquid surface L of deionized water in the tank 170. The lower edges of the heat transfer members 191 are at a level below the bottom surface of the tank 170. The heat generating device 190 is disposed in a lower part of the heat transfer member 191 such that the upper edge thereof is at a level below the level of the liquid surface L of deionized water and the lower edge thereof is at a level substantially corresponding to the bottom surface of the tank 170. Heat generated by the heat generating devices 190 is transferred to the heat transfer members 191, from which transferred to the side wall plates 177*a* and 177*b*, from which transferred to deionized water. In this case, since the upper edges of the heat transfer members 191 are at a level substantially corresponding to the level of the liquid surface L of deionized water, heat of the heated heat transfer members 191 can be efficiently transferred through the side wall plates 177*a* and 177*b* to deionized water contained in the tank. Thus the heat transfer members 191 and the side wall plates 177*a* and 177*b* are not heated at excessively high temperatures to ensure high safety.

The two main supply pipes 38 for carrying steam to the processing vessels 30A and 30B are connected to the tubular body 175. As shown in FIG. 15, a deionized water supply pipe 200 for carrying nitrogen gas and deionized water into the tank 170, a drain pipe 201 for draining deionized water from the tank 170, and the main supply pipe 38 (steam supply pipe 38) for carrying steam generated in the tank 170 to the processing chamber 30A are extended laterally through the left wall of the tubular body 175. The deionized water supply pipe 200 is disposed such that it supplies deionazed water below the level of the liquid surface L of deionized water. The drain pipe 201 is disposed so as to drain deionized water laterally from a bottom part of the tank 170. The main supply pipe 38 is disposed so as to send out steam laterally from the side part of the top region of the tank 170. A temperature sensor 202 is disposed between the deionized water supply pipe 200 and the drain pipe 201 to measure the temperature of deionized water.

Referring to FIG. 15, the main supply pipe 38 for carrying steam to the processing chamber 30B and a level gauge 210 are connected to the right part of the tubular body 175, namely, a side part opposed to a side part of the tubular body 175 to which the deionized water supply pipe 200, the drain pipe 201 and the main supply pipe 38 for carrying steam to the processing chamber 30A. The main supply pipe 38 for carrying steam to the processing chamber 30B is disposed so as to send out steam laterally from the side part of the top region of the tank 170. The level gauge 210 is composed of a measuring part 210*a* for measuring liquid level, a lower pipe 210*b* having a lower end opening into a bottom part of the tank 170 and an upper end connected to the lower end of the measuring part 210*a*, and an upper pipe 210*c* having an upper end opening into the tank 170 at a position above the level of the liquid surface L of deionized water and a lower end connected to the upper end of the measuring part 210*a*.

Two baffle plates 211 and 212 are disposed in a space between the surface L of deionized water and the main supply pipe 38. The baffle plates 211 and 212 are substantially parallel to the surface L of deionized water. The lower baffle plate 211 has four sides in contact with the tubular body 175 and the side wall plates 177*a* and 177*b*, and overlies the entire liquid surface L. The upper baffle plate 212 also has four sides in contact with the tubular body 175 and the side wall plates 177*a* and 177*b*, and overlies the entire liquid surface L and the baffle plate 211. The lower baffle plate 211 is provided at its parts corresponding to the right and left sides of the tubular body 175, as viewed in FIG. 15, with openings 213*a* and 213*b* to pass the generated steam. The upper baffle plate 212 is provided in its central part with an opening 214 to pass steam passed through the openings 213*a* and 213*b*.

As shown in FIG. 17, the opening 214 does not vertically overlap the openings 213*a* and 213*b*. Parts not provided with the opening 214 of the upper baffle plate 212 extend right above the openings 213*a* and 213*b*, respectively, and a part not provided with the openings 213*a* and 214*b* of the lower baffle plate 211 extends right below the opening 214. Steam generated under the lower baffle plate 211 flows through the openings 213*a* and 213*b*, is deflected by the upper baffle plate 212, flows through the opening 214 and flows into the main supply pipes 38. Therefore, even if the mist of heated deionized water is scattered or flows upward together with steam, the mist of deionized water can be trapped by the baffle plates 211 and 212. Thus the mist of deionized water is prevented from entering the main supply pipes 38 and from flowing into the processing vessels 30A and 30B. Thus, formation of water marks on the wafer W can be prevented. Since the distance between the surface L of deionized water and the level of the main supply pipes 38 is short, the tank 170 can be formed in a low overall height or in a large capacity. The mist of deionized water can be effectively trapped if steam meanders in a wide range when it passes through the baffle plates 211 and 212. The baffle plates 211 and 212 are formed of a material, such as PTFE, amorphous carbon or silicon carbide (SiC) ceramics, from which component materials will not be eluted by liquid-phase or gas-phase deionized water, or a material which dissolves little in deionized water, such as titanium.

A relief line 220 is connected to the left part of the tubular body 175 at a position between the baffle plates 211 and 212. Steam is discharged through the relief line 220 to reduce the internal pressure of the tank 170. Temperature and pressure in the tank 170 can be controlled by discharging steam generated in the tank 170 through the relief line 220 without supplying steam generated in the tank 170 through the main supply pipes 38 to the processing vessels 30A and 30B. Even if the output of the heaters 180 is fixed, the internal pressure of the tank 170 can be decreased, the temperature in the tank 170 can be kept constant and abnormal temperature rise can be prevented by properly discharging steam through the relief line 220. The internal temperature of the tank 170 is kept at about 120° C.

Referring to FIG. 3, the deionized water supply pipe 200 is provided with a flow regulating valve V2 and is connected to a deionized water source 225. A branch pipe 226 branched from the N$_2$ gas supply pipe 53 is connected to a part, downstream of the flow regulating valve V2, of the deionized water supply pipe 200. The branch pipe 226 is provided with a flow regulating valve V3. The flow regulating valves V2 and V3 operate similarly for opening and closing.

The drain pipe 201 is provided with a drain valve DV interlocked with the flow regulating valve V3, and a mist trap 227 at the downstream end thereof. The downstream end of the drain pipe 220 is connected to a part, downstream of the, drain valve DV of the relief line 200. The relief line 220 is provided with a flow regulating valve V4 and a shutoff valve V5. A branch pipe 230 is branched from the relief line 220 at a position upstream of the flow regulating valve V4, and is connected to the relief line 220 at a position downstream of the shutoff valve V5. The branch pipe 280 is provided with a relief valve RV1. The mist trap 227 cools deionized water drained through the drain pipe 201 and cools steam discharged through the relief pipe 22 to be condensed, and drains it through the drain pipe 91.

The heaters 180 of the steam generator 40 operate for a fixed output. As mentioned above, the flow regulating valves 50 are controlled so that steam generated by the steam generator 40 is supplied at the same flow rate to the processing vessels 30A and 30B. Assuming that the steam generator 40 generates steam at five units per unit time and steam is supplied simultaneously to both the processing vessels 30A and 30B, steam is supplied at two units to each of the processing vessels 30A and 30B, and steam is discharged at one unit from the tank 170 through the relief line 220. When steam is supplied simultaneously to both the processing vessels 30A and 30B, the opening of the flow regulating valve V4 is adjusted such that steam flows at one unit through the relief line 220, and the flow regulating valves 50 and the shutoff valve V5 placed in the relief line 220 are opened.

In a case where steam needs to be supplied only to either of the processing chamber 30A and 30B, such as a case where a wafer loading operation is being carried out at the processing chamber 30A(30B) and, at the same time, a resist solubilizing process using ozone and steam is being carried out at the processing chamber 30B (or 30A), steam is supplied at two units only to the processing chamber 30A or 30B and steam is discharged at three units through the relief line 220 while the steam generator 40 generates steam at five units. Therefore, the flow regulating valve V4 is adjusted so that steam flows at three units through the relief line 220 and one of the flow regulating valves 50 and the shutoff valve V5 are opened when steam is supplied only to either of the processing vessels 30A and 30B.

When steam is supplied to neither of the processing vessels 30A and 30B, all the steam generated at five units by the steam generator 40 is discharged through the relief line 220 by closing the flow regulating valves 50 and opening the shutoff valve V5 and the flow regulating valve V4.

Steam discharged through the relief line 220 flows into the mist trap 227 through the drain pipe 201. In an abnormal condition such as a condition where the internal pressure of the tank 170 is excessively high, the relief valve RV1 opens to discharge steam from the tank 170 through the relief line 220, the branch pipe 230, the relief line 220 and the drain pipe 201, in that order.

The flow rates at which steam is supplied to the processing chambers 30A and 30B can be regulated by discharging steam generated by the steam generator 40 through the relief line 220 at a controlled flow rate controlled by the flow regulating valve V4. Even if the number of the processing vessels to which steam is supplied simultaneously is changed, the respective set conditions of the flow regulating valves 50, which are previously determined so that steam can be supplied at the same flow rate to both the processing chambers 30A and 30B, do not need to be changed, and the flow regulating valves 50 merely need to be opened or closed. Such a method of regulating the flow of steam supplied to the processing chambers 30A and 30B is easy as compared with a method that regulates the set conditions of the flow regulating valves 50 or controls the output of the heaters 180 for flow regulation. Thus, the flow rates at which steam is supplied to the processing chambers 30A and 30B can be accurately regulated according to processes to be carried out in the processing chambers 30A and 30B and, consequently, the uniformity and the reliability of the resist solubilizing process can be improved.

Wafer processing steps to be carried out by the processing system 1 as structured above will be described. Wafers W are taken out of a carrier C placed on the table 6 of the in-out port 4 one by one by the wafer loading-unloading arm 11. The wafer loading-unloading arm 11 carries the wafer W to the wafer transfer unit 17. The main wafer conveyer 18 receives the wafer W from the wafer transfer unit 17 and carries the wafer W to a desired one of the substrate processing units 23a to 23h. Each of the substrate processing units 23a to 23h solubilizes a resist film coating a surface of the wafer W. After the completion of the resist solubilizing process, the carrying arm 18a takes out the wafer W from each of the substrate processing units 23a to 23h. Then, the wafer W is transferred to a desired one of the substrate cleaning units 12, 13, 14 and 15, and is subjected to a washing process by which the water-solubilized resist adhering to the wafer is removed from the wafer by using pure wafer or the like. When necessary, each of the substrate cleaning units 12, 13, 14 and 15 performs a particle-and-metal removing process and a drying process, after the completion of the wafer washing process. Then, the carrying arm 18a carries the wafer W to-the wafer transfer unit 17. The wafer loading-unloading arm 11 receives the wafer W from the wafer transfer unit 17 and puts the wafer W, from which the resist is removed, in the carrier C.

The operation of the substrate processing unit 23a will be described as a representative example of the operations of the substrate processing units 23a to 23h. The lid 101 is separated from the vessel body 100, and the carrying arm 18a, holding a wafer W, of the main wafer conveyer 18 is moved to a position under the lid 101, and the holding members 136 of the lid 101 receives the wafer W from the carrying arm 18a (Wafer Receiving Step). Then, the cylinder actuator 102 is driven to lower the lid 101 toward the vessel body 100, and consequently, the holding members 136 advance into the circular groove 100c of the vessel body 100 and the wafer W is transferred from the holding members 136 to the support members 111 of the vessel body 100 (Wafer Transfer Step). Gap G is formed between the lower surface of the wafer W and the upper surface of the lower plate 110. After the wafer W has thus been transferred from the holding members 136 to the support members 111, the lid 101 is lowered further so that the lid 101 is set close on the upper surface of the circumferential wall 100b of the vessel body 100 and the O-rings 115a and 115b are compressed to seal the vessel body 100 (Sealing Step).

After the lid 101 has been joined close to the vessel body 100, the heaters 105 and 135 are energized to heat the internal atmosphere of the processing chamber 30A and the wafer W to promote the resist solubilzing process of the wafer W. Subsequently, the supply selector 41 is operated to supply ozone gas having a predetermined ozone concentration from the ozone generator 42 through the ozone supply pipe 51 into the processing chamber 30A. Ozone gas is supplied into the processing chamber 30A at a controlled flow rate depending on the opening of the flow regulating valve 52. The first discharge regulating valve 71 of the exhaust selector 65 is opened, and the discharge rate at which the fluid is discharged from the processing chamber 30A through the discharge pipe 60 is controlled by the first discharge regulating valve 71. In this way, an ozone gas atmosphere is established in the processing chamber 30A while the internal pressure of the processing chamber 30A is kept constant, by supplying ozone gas to the processing chamber 30A while evacuating the processing chamber 30A through the discharge pipe 60. The interior of the processing chamber 30A is kept at a pressure higher than the atmospheric pressure, such as a gauge pressure of about 0.2 MPa. Thus, the processing chamber 30A is filled up with ozone gas having the predetermined ozone concentration. The internal atmosphere of the processing chamber 30A and the wafer W are kept at the predetermined temperatures by the heaters 105 and 135. The atmosphere of the processing chamber 30A discharged through the discharge pipe 60 is delivered to the mist trap 61.

In the meantime, in the steam generator 40, the heat generating devices 190 of the two heaters 180 generate heat, and the heat is transmitted from the heat generating devices 190 to the heat transfer members 191, and then to the side wall plates 177a and 177b, and then to deionized water contained in the tank 170, and thereby steam is generated. The temperature of the interior of the tank 170 is regulated at about 120° C. The interior of the tank 170 is maintained in a pressurized state due to the heat. The internal pressure of the tank 170 is decreased by discharging steam generated in the tank 170 through the relief line 220 to keep the temperature of the interior of the tank 170 at about 120° C. Steam discharged through the relief line 220 is cooled by the mist trap 227 and is discharged through the drain pipe 91.

After the ozone-gas filling, the flow regulating valve 50 is operated to supply ozone gas and steam simultaneously to carry out the resist solubilzing process. The steam and the ozone gas are supplied simultaneously into the processing chamber 30A, while the internal atmosphere of the processing chamber 30A is discharged therefrom by opening the first discharge regulating valve 71 of the exhaust selector 65 placed in the discharge pipe 60. Steam supplied by the steam generator 40 flows through the main supply pipe 38 while the temperature thereof is regulated at a predetermined temperature of, for example about 115° C., is mixed with ozone gas in the supply selector 41, and is supplied into the processing chamber 30A. At this time, the interior of the processing chamber 30A is also kept at a pressure higher than the atmospheric pressure, such as a gauge pressure of about 0.2 MPa. The heaters 105 and 135 maintain the temperature of the internal atmosphere of the processing chamber 30A and the wafer W. In this way, the mixed process fluid of ozone gas and steam filling up the processing chamber 30A oxidizes (solubilizes) the resist film coating the surface of the wafer W (Processing Step).

During the resist solubilizing process, ozone gas is supplied through the main supply pipe 38 into the processing chamber 30A while the flow rate of the ozone gas is regulated depending on the opening of the flow regulating valve 52. Steam is supplied through the main supply pipe 38 into the processing chamber 30A while the flow rate of the steam is regulated depending on the opening of the flow regulating valves 50 and V4. In the meantime, the first discharge regulating valve 71 of the exhaust selector 65 is opened, and the discharge rate from the processing chamber 30A through the discharge pipe 60 is regulated by the first discharge regulating valve 71. In this way, the mixed process fluid of ozone gas and steam is supplied into the processing chamber 30A while maintaining the pressure in the processing chamber 30A, by supplying the ozone gas and the steam while discharging the atmosphere in the processing chamber 30A through the discharge pipe 60.

During the resist solubilizing process, the supply of the mixed process fluid through the main supply pipe 38 is continuously performed, and the discharge of the mixed process fluid through the discharge pipe 60 is continuously performed. The mixed process fluid flows along the upper surface of the wafer W, the lower surface of the wafer W (the gap G) and the circumference of the wafer W toward the discharge port 121 and the discharge pipe 60. The resist solubilizing process for the wafer W may be carried out by using the mixed process fluid filling up the processing chamber 30A, by stopping the supply of the mixed process fluid through the main supply pipe 38 and stopping the discharge of the mixed process fluid through the discharge pipe 60 while keeping the internal pressure of the processing chamber 30A constant.

After the resist solubilizing process has been completed, the mixed process fluid of ozone gas and steam is exhausted from the processing chamber 30A. First, the flow selector valve 55 is switched to the side of the high-flow passage 55a to supply a large amount of $N_2$ gas from the $N_2$ gas source 43 into the processing chamber 30A, and the second discharge regulating valve 72 of the exhaust selector 65 placed in the discharge pipe 60 is opened. Thereby, $N_2$ gas is supplied while the internal atmosphere in the processing chamber 30A is discharged. Consequently, the main supply pipe 38, the processing chamber 30A and the discharge pipe 60 are purged with $N_2$ gas. The discharged ozone gas is discharged through the discharge pipe 60 into the mist trap 61.

Subsequently, the cylinder actuator 102 is driven to raise the lid 101, thereby the holding members 136 rise from the circular groove 100c to come into contact with opposite peripheral parts of the wafer W to receive the wafer W from the support members 111, and the lid 101 is separated from the vessel body 100. Then, the carrying arm 18a of the main wafer conveyer 18 advances to a position under the lid 101, receives the wafer W from the holding members 136 and carries the wafer W away from the processing chamber 30A.

With this substrate processing unit 23a, as the tank 170 is formed of the composite of PFA and PTFE, creeping of the tank 170 can be prevented, and faulty sealing thus can be prevented. Since the upper edges of the heat transfer members 191 are positioned at a level substantially corresponding to the level of the surface L of deionized water, the heat transfer members 191 and the side wall plates 177a and 177b are not heated at excessively high temperatures, which ensures high safety. Since the surfaces of the tank 170 to be exposed to deionized water are formed of the composite of PFA and PTFE and high-purity titanium, these surfaces do not substantially dissolve in deionized water. Therefore, practically no particles are produced in the processing chamber 30A even if the materials forming the walls of the tank 170 leak into the processing chamber 30A and hence there is not any adverse effect on the process for the wafer. Since the baffle plates 211 and 212 trap the mist of deionized water effectively to prevent the flow of the mist of deionized water through the main supply pipes 38 into the processing vessels 30A and 30B, formation of water marks on the wafer W can be prevented. The tank 170 can be formed in a low height or in a large capacity.

Although the present invention has been described in terms of its preferred embodiment, the present invention is not limited in its practical application to the preferred embodiment specifically described above. For example, substrates are not limited to semiconductor wafers, but may be glass substrates for LCDs, disks for CDs, printed circuit boards or ceramic substrates.

Figure 18:
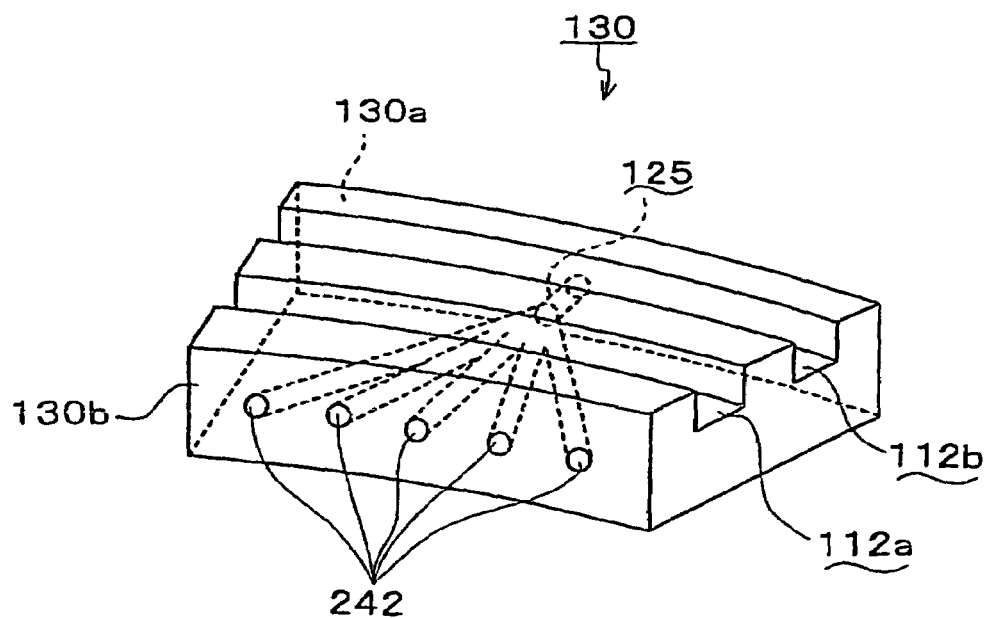
FIG. 18 is a perspective view of a supply nozzle holding part in a modification of the supply nozzle holding part shown in FIG. 10.

A manifold supply nozzle 240 as shown in FIG. 18 may be used. The supply nozzle 240 has an inlet part 125 having an inlet end opened in the outer circumference of the circumferential wall 100b and connected to the main supply pipe 38, and five outlet parts 242 passing through the circumferential wall and horizontally radiating out from the inlet part 241 toward the interior of the chamber 30A. Since the outlet parts 242 radiate out into the processing chamber 30A, the process fluid can be supplied radially to diffuse the process fluid efficiently. When forming the supply nozzle 240, a nozzle forming segment 130 is cut out from the circumferential wall 100b, the inlet part 241 is formed in the nozzle forming segment 130 by machining the nozzle forming segment 130 from the side of the convex outer surface 130a, the outlet parts 242 are formed by boring the nozzle forming segment 130 in directions toward the inlet part 241 from the horizontally aligned five parts on the concave inner surface 130b. Then, the nozzle forming segment 130 thus provided with the manifold supply nozzle 240 is fitted in a recess 131 formed in the circumferential wall 100b when the nozzle forming segment 130 is cut out and the nozzle forming segment 130 is welded to the circumferential wall 100b.

In this embodiment, the nozzle forming segment 130 is cut out from the circumferential wall 100b, and then the nozzle forming segment 130 is machined to form the supply nozzle 120. The nozzle forming segment 130 and the vessel body 100 may be separate members separately formed by processing individual workpieces. When the vessel body 100 and the nozzle forming segment 130 are formed separately, the vessel body 100 is provided with a recess for receiving the nozzle forming segment 130, and the nozzle forming segment 130 is provided with the supply nozzle 120. The nozzle forming segment 130 provided with the supply nozzle 120 is fitted in the recess of the vessel body 100 and is welded to the vessel body 100 to complete the circumferential wall 100b of the vessel body 100.

In this embodiment, the single steam generator 40 is connected to the two processing vessels 30A and 30B. Three or more main supply pipes 38 may be connected to the upper part of the tubular body 175 and the three or more main supply pipes 38 may be connected to three or more processing vessels to supply steam to three or more processing vessels by the single steam generator 40.

The tubular body 175 may be formed of PTFE. The side wall plates 177a and 177b may be formed of SiC or amorphous carbon. Metal elution does not occur in PTFE, SiC and amorphous carbon. Therefore, adhesion of particles to the wafer and metal contamination of the wafer, due to the leakage of materials forming the surfaces of the members exposed to deionized water into the processing chamber 30A, can be prevented.

The tank 170 may be provided with three or more baffle plates. Preferably, the openings of the adjacent baffle plates do not overlap each other so as to cause steam to meander in a wide range before reaching the main supply pipes 38. Thus the mist of deionized water can be effectively trapped by the baffle plates, the mist of deionized water can be prevented from entering the main supply pipes 38 and from flowing into the processing vessels 30A and 30B and hence formation of water marks on the wafer W can be prevented.

The ratio of the steam generating rate at which the steam generator 40 generates steam to steam supply rate at which steam is supplied to the processing chamber 30A or 30B is not limited to 5:2 as described above. For example, if the steam generator 40 supplies steam to three or more processing vessels, the steam generating rate is increased accordingly, and the ratio is changed properly.

The tank 170 of the foregoing embodiment does not creep and hence the sealing of the tank 170 will not be deteriorated. Since the heat transfer members and the side wall plates are prevented from excessive heating, safety can be improved. Practically, the materials forming the walls exposed to deionized water do not substantially enter the processing vessel and do not substantially form particles. Consequently, the substrate is prevented from being affected adversely by those materials. Formation of water marks on the substrate can be prevented. The tank can be formed in a low height and in a large capacity.

Figure 19:
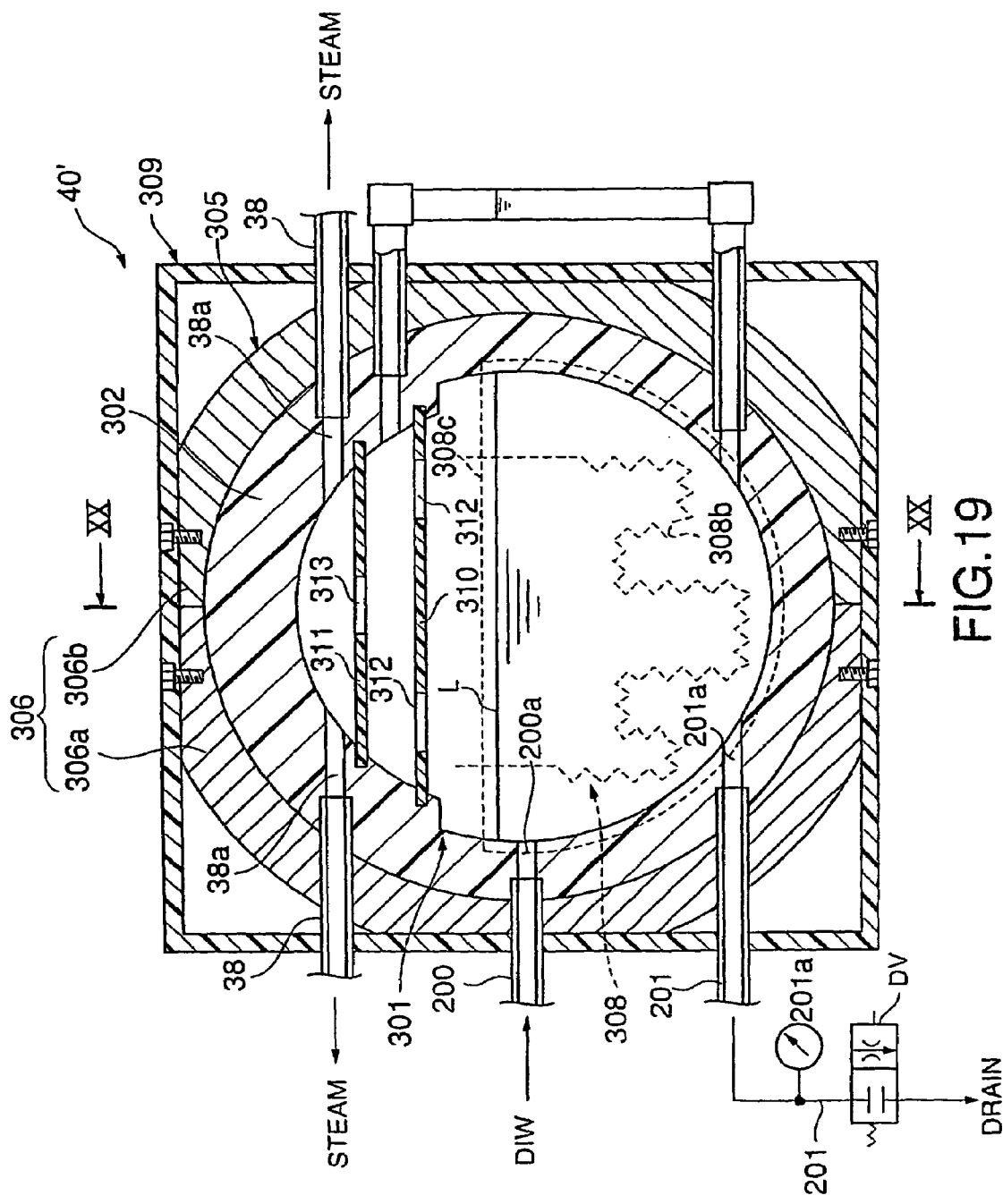
FIG. 19 is a longitudinal sectional view of another possible steam generator.
Figure 20:
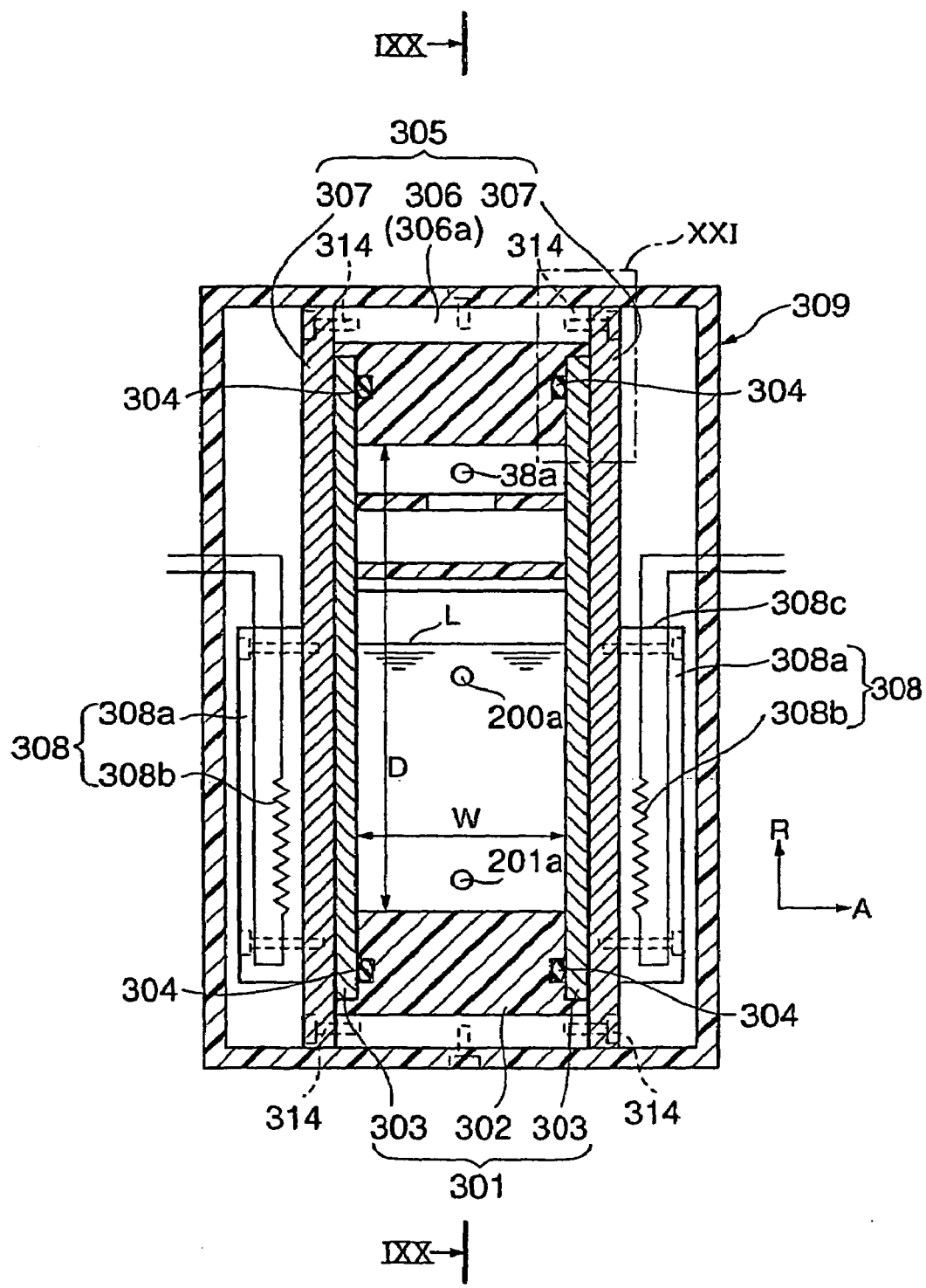
FIG. 20 is a sectional view taken on the line XX—XX in FIG. 19.
Figure 21:
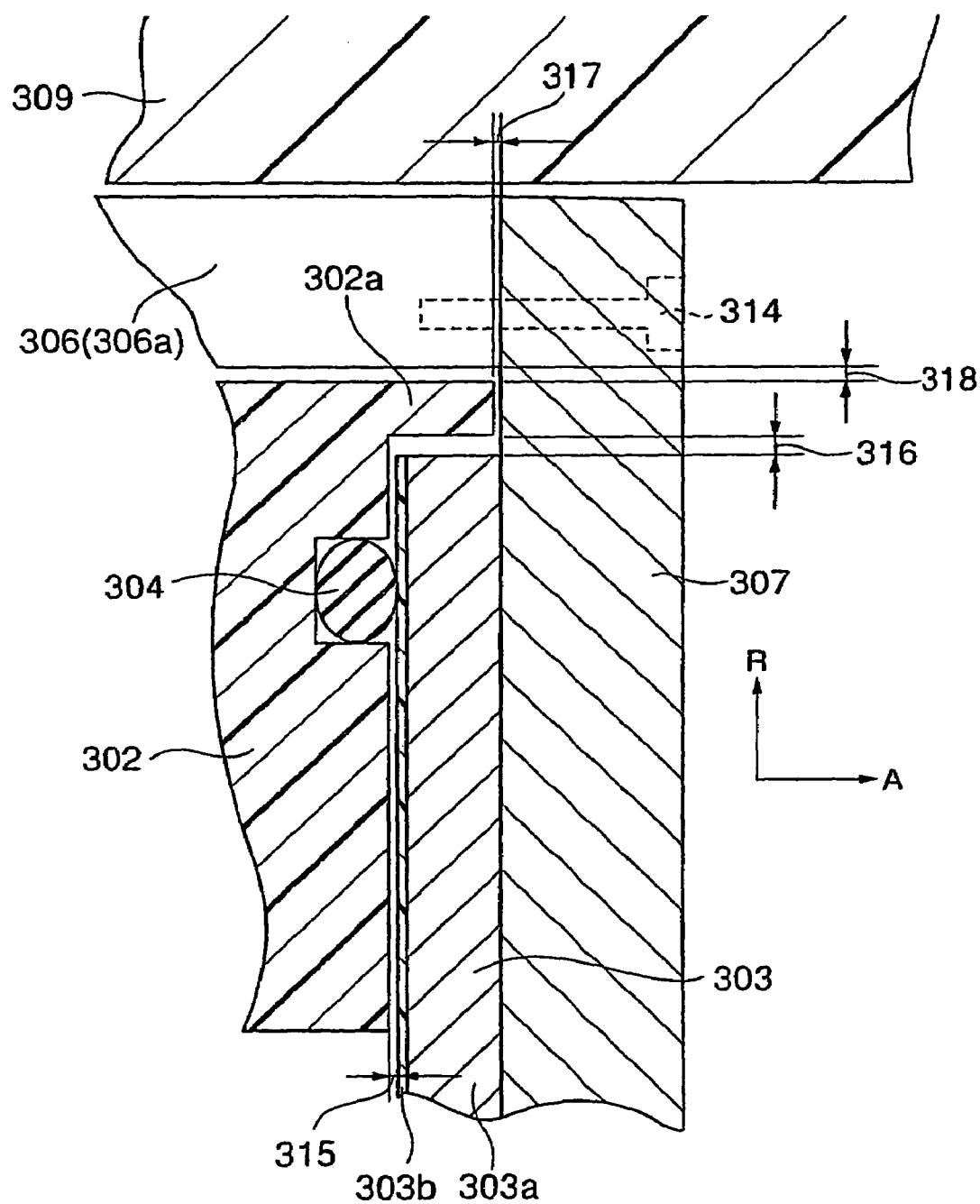
FIG. 21 is an enlarged sectional view of a section XXI in FIG. 20.

The steam generator may be structured as shown in FIGS. 19 to 21. The steam generator 40' has a thin, cylindrical tank 301. The tank 301 has an annular, hollow body 302 disposed with its center axis extended horizontally and having open ends opposed to each other with respect to the axial direction, and disk-shaped side wall plates 303 covering the opposite open ends of the hollow body 302, respectively. In view of improving steam generating efficiency, the distance W between the side wall plates 303 is smaller than the inside diameter D of the hollow body 302.

The hollow body 302 is provided with a plurality of bores for receiving a plurality of pipes, which will be described later. With a view to preventing the elution of substances detrimental to processing wafers W not only from the inner circumference of the hollow body 302 but also from the surfaces of the bores, the hollow structure 302 is formed of a resin, preferably a composite of PFA and PTFE. The composite of PTFE and PFA has high creep resistance and nothing detrimental to processing wafers W is eluted by deionized water. Commercially available suitable composites of PTFE and PFA are, for example, New Valflon® EX1 provided by Nippon Valqua Industries, LTD., and Teflon® 70-J provided by DuPont-Mitsui Fluorochemicals Co. LTD. Another resin material such as PTFE, PFA, or PEEK (polyetheretherketone) may be used as a material for the hollow body 302.

Desirably, nothing detrimental to processing wafers W is eluted by deionized water from the inner surfaces of the side wall plates 303 of the tank 301. Since the side wall plates 303 define heat transmitting paths for transmitting heat generated by heaters to deionized water contained in the tank 301, it is desirable to form the side wall plates 303 of a material having high thermal conductivity. To this end, as specifically shown in FIG. 21, each side wall plate 303 consists of a base plate 303a of an aluminum alloy, and a PFA coating 303b coating the inner surface of the base plate 303a. Nothing detrimental to processing wafers W is eluted from the PFA resin by deionized water when the PFA coating is exposed to an atmosphere of liquid-phase or gas-phase deionized water.

The side wall plates 303, similarly to those of the tank included in the embodiment shown in FIGS. 15 to 17, may be formed of high-purity titanium. When the side wall plates 303 are formed of high-purity titanium, the side wall plates 303 do not necessarily need to be coated with the PFA coatings 303b. However, with a view to completely preventing the elution of substances detrimental to processing wafers W, particularly, metal elution by deionized water, it is preferable to coat the side wall plates 303 with a resin material such as PFA, from which substances detrimental to processing wafers W are not eluted by deionized water. The side wall plates 303 may be formed of amorphous carbon. Amorphous carbon has high thermal conductivity and nothing detrimental to processing wafers W is eluted from amorphous carbon when exposed to an atmosphere of liquid-phase or gas-phase deionized water. The side wall plates 303 formed of amorphous carbon do not need to be coated with the PFA coating 303b.

An annular groove is formed in each of the side surfaces of the hollow body 302. An O-ring is fitted in the annular groove to seal the gap between the hollow body 302 and the side wall plate 303 in airtight and watertight fashion. The O-ring is formed of a material having high heat resistance and not permitting the elution of substances detrimental to processing wafers W by deionized water. Preferable materials for forming the O-ring are fluororubbers and perfluoroelastomers. For example, Kalrez® provided by DuPont Dow Elastomers L.L.C. is a preferable, commercially available perfluorelastomer.

The tank 301 is covered with a shell 305. The shape of the inner surface of the shell 305 is substantially complementary to that of the outer surface of the tank 301. The shell 305 has an annular body 306 surrounding the hollow body 302, and disk-shaped side wall plates 307 arranged outside the side wall plates 303. The annular body 306 is formed by joining two half segments 306a and 306b. The shell 305 has a rigidity sufficient to prevent the deformation of the hollow body 302 and the side wall plates 303 of the tank 301 by the internal pressure of the tank 301. In this embodiment, the shell 305 is formed of a metallic material having a sufficient thickness. Since the side wall plates 307 of the shell 305 define heat transmission paths for transmitting heat generated by heaters to deionized water contained in the tank 301, it is desirable that the side wall plates 307 have high thermal conductivity. In this embodiment, the annular body 306 and the side wall plates 307 of the shell 305 are formed of an aluminum alloy.

Heaters 308 are disposed on the outer surfaces of the side wall plates 307 of the shell 305. Each heater 308 has a heat transfer block 308a formed of a metal having a high thermal conductivity, such as an aluminum alloy, and a resistance-heating wire 308b embedded in the heat transfer block 308a. The resistance-heating wire 308b generates heat when power is supplied thereto from a power source, not shown, to heat and vaporize deionized water contained in the tank 301. The upper edge 308c of the heat transfer block 308a extends horizontally and is at a level substantially corresponding to the predetermined level of the surface L of deionized water contained in the tank 301. The lower edge of the heat transfer block 308 is at a level below the bottom of the tank 301. The resistance-heating wire 308b is extended in a range between an upper position below the level of the surface L of deionized water and a lower position substantially corresponding to the bottom of the tank 301. Heat generated by the resistance-heating wires 308b is transferred through the heat transfer blocks 308, the side wall plates 307 of the shell 305 and the side wall plates 303 of the tank 301 to deionized water contained in the tank 301. Due to the foregoing positional relation of the heaters 308 with respect to the tank 301, the steam generator 40', similarly to the steam generator shown in FIGS. 15 to 17, is able to heat deionized water contained in the tank 301 efficiently.

The shell 305 and the heat plates 308 are covered with a casing 309, which is formed of a heat-insulating material.

The hollow body 302 of the tank 301 is provided with two main supply ports 38a, a deionized water inlet port 200a and a drain port 201a. The deionized water inlet port 200a opens into the tank 301 at a position below the predetermined level of the surface L of deionized water to supply deionized water from a position below the surface L of deionized water contained in the tank 301. The drain port 201a opens into the interior of the tank 301 at the bottom of the tank 301. The main supply ports 38a opens at upper parts of the tank 301. The main supply pipes 38, the deionized water supply pipe 200 and the drain pipe 201, which are passed through the shell 306 and the hollow body 302, are connected to the main outlet pores 38a, the deionized water inlet port 200a and the drain port 201a, respectively. At least the inner surfaces of those pipes 38, 200 and 201 are formed of PTFE resin or PFA resin to prevent the elution of substances detrimental to processing wafers W from the pipes 38, 200 and 201 by deionized water. Preferably, the pipes 38, 200 and 201 are formed of PTFE, however, may be metal pipes coated with PTFE or PFA.

The tank 301 is provided with a level gauge 210. The level gauge 210 has a measuring part 210a for measuring liquid level, a lower pipe 210b connected to the lower end of the measuring part 210a, and an upper pipe 210c connected to the upper end of the measuring part 210a. The lower pipe 210 is passed through the annular body 306 and the hollow body 302 and is connected to a hole for the lower pipe opening into a bottom portion in the tank 301. The upper pipe 210c is passed through the annular body 306 and the hollow body 302 and is connected to a hole for the upper pipe opening into an upper portion in the tank at a position above the surface L of deionized water where the opening of the hole does not contact deionized water contained in the tank 301.

The measuring part 210a has a pipe 210d extending vertically and connected to the upper pipe 210b and the lower pipe 210c, and a level sensor, not shown, attached to the pipe 210d. The level sensor may be provided with a float floating in deionized water contained in the pipe 210d. Alternatively, the pipe 210d may be formed of a transparent material and the level sensor may be an optical level sensor capable of optically detecting the level of deionized water in the pipe 210d. A detection signal provided by the level sensor is sent to a controller, not shown, the controller controls a flow control valve V2 (see FIG. 22) so as to keep the surface L of deionized water contained in the tank 301 at a fixed level. Thus the level of deionized water contained in the tank 301 is controlled by a level regulating means including the controller, not shown, and the flow control valve V2. During the normal operation of the steam generator 40 the interior of the tank 301 is divided into a lower space where liquid-phase deionized water always exists and an upper space where gas-phase deionized water stage always exist.

Constant electric power is supplied to the heaters 308. As deionized water contained in the tank 301 is kept at the fixed level, an amount of steam generated by the steam generator 40' per unit time is substantially constant.

The surfaces of the components of the level gauge 210, namely, the pipes 210b, 210c and 210d and the sensor, are made of a material from which substances detrimental to processing wafers W will not be eluted when the material is exposed to liquid-phase or gas-phase deionized water.

Two baffle plates 310 and 311 are disposed at positions higher than the surface L of deionized water contained in the tank 301 and lower than locations where the main outlet ports 38a open into the tank 301. The opposite longitudinal ends of the baffle plates 310 and 311 are fitted in grooves formed in the hollow body 302. The opposite lateral ends of the baffle plates 310 and 311 are in contact with or slightly spaced apart from the side wall plates 303. Thus the baffle plates 310 and 311 cover the surface of deionized water contained in the tank 301 entirely. The baffle plates 310 and 311 are provided with openings 312 and 313, respectively. The openings 312 and 313 of the baffle plates 310 and 311 are arranged in an arrangement similar to that mentioned above in connection with FIGS. 15 to 17, and the baffle plates 310 and 311 exercise functions similar to those of the baffle plates mentioned above in connection with FIGS. 15 to 17. The baffle plates 310 and 311 may be formed of a material, e.g., PTFE, from which a negligibly small amount of substances detrimental to processing wafers W may be eluted when the baffle plates 310 and 311 are exposed to the vapor of deionized water.

The temperature sensor 202, which is included in the steam generator 40 shown in FIGS. 15 to 17, is omitted in the steam generator 40' shown in FIGS. 19 to 21. The relief line 220, which is directly connected to the tank 170 of the steam generator 40 shown in FIGS. 15 to 17, is not directly connected to the tank 301 of the steam generator 40' shown in FIGS. 19 to 21. Since the temperature sensor 202 is omitted, no members formed of metals are placed inside the tank 301 at all.

The hollow body 302 and the side wall plates 303 of the tank 301 are connected without using any mechanical fastening members penetrating those members, such as bolts. The O-rings 304 are fitted in the annular grooves formed in the side surfaces of the hollow body 302, and the side wall plates 303 are disposed on the side surfaces of the hollow body 302. Then, the annular body 306 (i.e., the half segments 306a and 306b) of the shell 305 is disposed around the hollow body 302 of the tank 301, and the side wall plates 307 of the shell 305 are disposed on the outer surfaces of the side wall plates 303. Then, the side wall plates 307 are fastened to the annular body 306 with a plurality of threaded bolts 314. For the purpose of the bolt fastening, a plurality of threaded holes are formed at angular intervals in the side surfaces of the annular body 306, and the disk-shaped side wall plates 307 are provided in their peripheral parts with bolt holes at positions corresponding to the threaded holes of the annular body 306.

As the bolts 314 are screwed in the threaded holes, the side wall plates 307 and the side wall plates 303 in contact with the side wall plates 307 are pressed toward the hollow body 302 and the O-rings 304 are squeezed. Thus, the hollow body 302 and the side wall plates 303 are joined together in an airtight and liquid-tight fashion. Upon completion of the fastening of the bolts 314, a strong shell structure surrounding the tank 301 is formed. The conditions of the tank 301 and shell 305 at this moment are shown in FIG. 21.

As shown in FIG. 21, a very narrow axial (i.e., the axial direction of the tank 301, or A-direction) gap 315 is formed between each side surface of the hollow body 302 and the side wall plate 303. A narrow radial (i.e., the radial direction of the tank 301, or R-direction) gap 316 is formed between the inner circumference of a peripheral wall 302a axially protruding from the hollow body 302 and the circumference of the side wall plate 303. A narrow axial (i.e., A-direction) gap 317 is formed between the end surface of the peripheral wall 302a protruding from the hollow body 302 and the side wall plate 307. A narrow radial (i.e., R-direction) gap 318 is formed between the outer circumference of the hollow body 302 and the annular body 306. Those gaps 315 to 318 prevent high contact pressure on the adjacent members due to the difference in thermal expansion between the materials of the tank 301 and 304 (i.e., a resin and a metal), and thus prevent the resin material having comparatively low creep resistance from being damaged. Particularly, the gap 315 between each of the side surfaces of the hollow body 302 and the corresponding side wall plate 303 is effective in preventing the production of particles by rubbing between the side surface of the hollow body 302 and the side wall plate 303. The thicknesses of the gaps 315 to 318 are determined properly taking into consideration temperature distribution in the steam generator 40' during operation and the dimensions of the component members.

As apparent from the foregoing description, the hollow body 302 and the side wall plates 303 of the tank 301 are connected with each other, as the surrounding shell 305 restrains them. The side wall plates 303 are connected to the hollow body 302 without using any mechanical fastening members, such as bolts, penetrating the side wall plates 303 and the hollow body 302. Therefore, trouble due to creeping of fastened parts can be reduced greatly. Since the shell 305 has a sufficient rigidity, the deformation of the hollow body 302 and the side wall plates 303 due to increase in the internal pressure of the tank 301 can be prevented. Accordingly, the components of the tank 301, notably the hollow body 302, do not need to be formed of metals and may be formed of resins such as PTFE and PFA. Since the hollow body 302 has an annular shape, the internal pressure of the tank 301 will not be locally concentrated. Since the hollow body 302 is surrounded by the annular body 306 of the shell 305 with the gap 318 formed between the hollow body 302 and the annular body 306, it is effective to form the hollow body 302 in an annular shape from the point of view of preventing the hollow body 302 from local deformation.

The steam generator 40' shown in FIGS. 19 to 21 is simple in construction and can be easily assembled and disassembled.

Description will be made of a piping system included in a substrate processing apparatus to which the steam generator 40' shown in FIGS. 19 to 21 is applied in connection with FIG. 22. Only part of the piping system different from the piping system shown in FIG. 3 will be described.

With the omission of the relief line 220 directly connected to the tank 301, relief pipes 220a and 220b are connected to parts, adjacent to and upstream of the flow regulating valves 50, of main supply pipes 38, respectively. The relief pipes 220a and 220b are joined to a relief line 220. The construction of a part, downstream of the junction of the relief pipes 220a and 220b, of the relief line 220 is the same as that of the corresponding part of the relief line 220 shown in FIG. 3.

Figure 22:
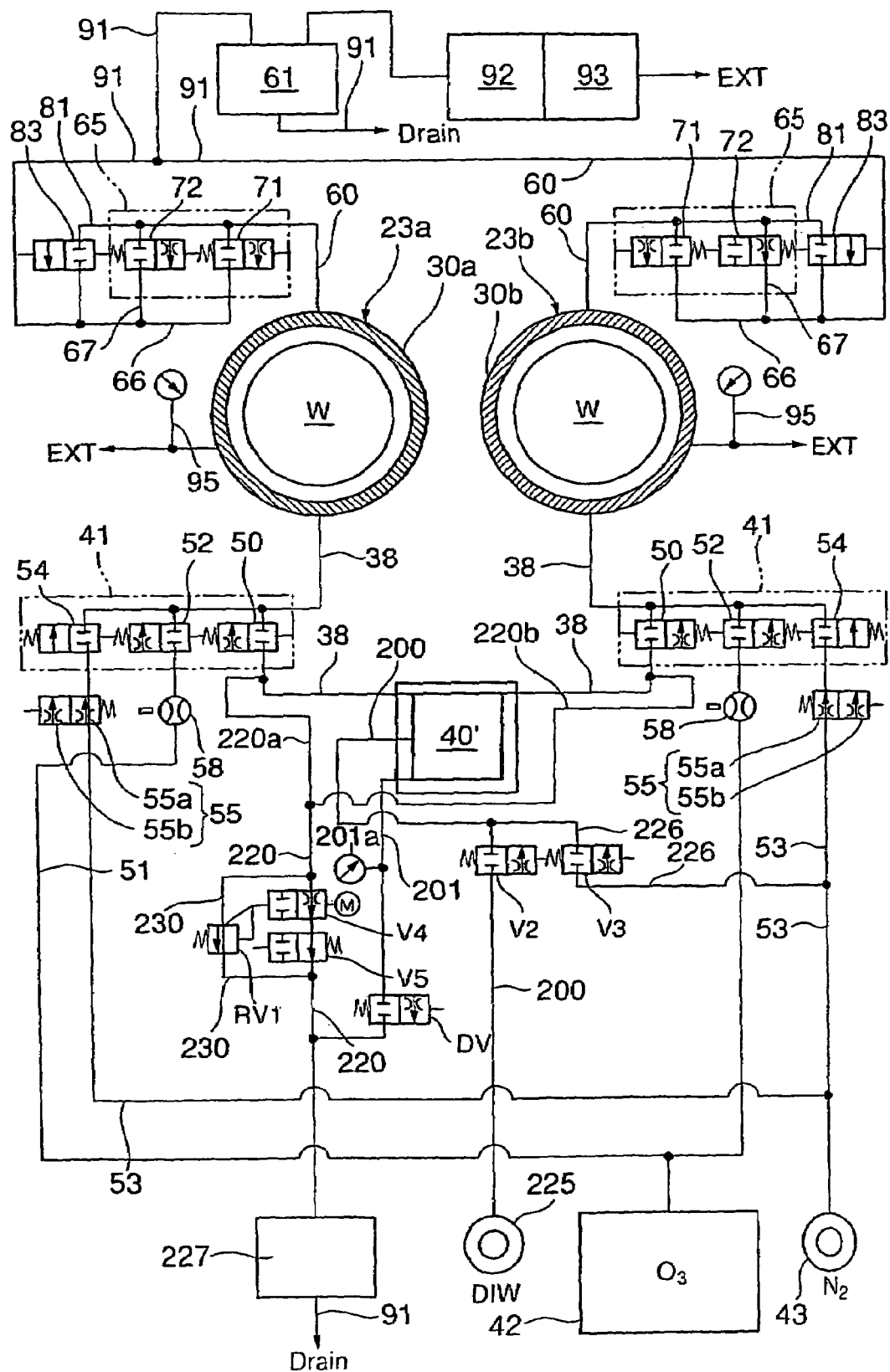
FIG. 22 is a piping diagram of a piping system to be employed in the substrate processing apparatus when the steam generator shown in FIG. 19 is employed.

In the embodiment shown in FIG. 22, all the steam generated by the steam generator 40' is sent out into the main supply pipes 38 regardless of the steam demand of the processing chambers 30A and 30B. If only the processing chamber 30A needs steam, the flow regulating valve 50 placed in the main supply pipe 38 connected to the processing chamber 30B is closed. Consequently, steam sent into the main supply pipe 38 connected to the processing chamber 30B is discharged through the relief pipe 220b and the relief line 220 into a mist trap 227. When both the processing chambers 30A and 30B need steam, the two flow regulating valves 50 are opened and the shutoff valve V5 is closed. In this state, any steam does not flow through the relief pipes 220a and 220b and the relief line 220. When both the processing chambers 30A and 30B do not need steam, the two flow regulating valves 50 are closed and the shutoff valve V5 is opened.

As apparent from the foregoing description, a part, between the steam generator 40' and the flow regulating valve 50, of each main supply pipe 38 is filled up with hot steam which has just been generated by the steam generator 40' regardless of the steam demand of the processing chambers 30A and 30B. Therefore, the temperature regulator 57 included in the piping system shown in FIG. 3 is not necessary.

In the embodiment shown in FIG. 22, a pressure gauge 201a is connected to a part, upstream of a drain valve DV, of a drain pipe 201. As obvious from FIG. 19, the internal pressure of the tank 301 of the steam generator 40' is applied through deionized water (liquid), to the pressure gauge 201a, the pressure gage 201a is capable of monitoring steam pressure in the tank 301.

The invention claimed is:

1. A substrate processing apparatus comprising:
    a steam generator having a tank and at least one heater, and adapted to generate steam by heating deionized water contained in the tank to vaporize the deionized water with the heater; and
    a processing vessel adapted to process therein a substrate with steam generated by the steam generator,
    wherein:
    the tank includes a hollow, tubular body arranged with the axis thereof extending horizontally and having opposite open ends, and a pair of plate members covering the opposite open ends of the tubular body to define an interior space of the tank together with the tubular body;
    the tubular body is formed of a resin material; and
    said at least one heater is disposed outside the interior space of the tank while contacting with or arranged adjacent to an outer surface of at least one of the plate members.

2. The substrate processing apparatus according to claim 1, wherein the resin material forming the tubular body is a composite of PTFE (polytetrafluoroethylene) and PFA (perfluroethylene).

3. The substrate processing apparatus according to claim 1, wherein the plate member contacting with or arranged adjacent to the heater is formed of a material having a thermal conductivity higher than that of the resin material forming the tubular body.

4. The substrate processing apparatus according to claim 3, wherein the plate member contacting with or arranged adjacent to the heater is formed of a metal, and has a surface provided thereon with a coating layer of a resin material.

5. The substrate processing apparatus according to claim 1, further comprising a shell surrounding the tank to restrict deformation of the tank due to an internal pressure of the tank, wherein the heater is mounted to the shell at a position adjacent to the plate member.

6. The substrate processing apparatus according to claim 1, wherein:
    the pair of plate members are formed of a material having a thermal conductivity higher than that of the resin material forming the tubular body;
    two heaters are provided as said at least one heater;
    the two heaters are disposed outside the interior space of the tank while contacting with or arranged adjacent to outer surfaces of the pair of plate members.

7. The substrate processing apparatus according to claim 6, wherein the pair of the plate members are formed of a metallic material, and surfaces of the plate members are provided thereon with coating layers of a resin material.

8. The substrate processing apparatus according to claim 1, wherein:
    the heater includes a heat transfer block and a heating element provided at the heat transfer block;
    an upper edge of the heat transfer block is located at a level substantially corresponding to a set level of deionized water contained in the tank; and
    the heating element is placed in a lower part of the heat transfer block.

9. The substrate processing apparatus according to claim 1, wherein:
- a deionized water supply line for supplying deionized water into the tank, a drain line for draining deionized water from the tank and a steam discharge line for discharging steam from the tank penetrate the tubular body;
- the deionized water supply line opens into the tank at a position below a set level of deionized water in the tank,
- the drain line opens into the tank at a position below the set level of deionized water in the tank, and
- the steam discharge line opens into the tank at a position above the set level of deionized water in the tank.

10. The substrate processing apparatus according to claim 1, wherein:
- the tank is provided with a steam outlet port through which steam generated in the tank is sent out toward the processing vessel, and
- at least one baffle plate is placed in the tank to prevent the mist of deionized water from reaching the steam outlet port.

11. The substrate processing apparatus according to claim 10, wherein:
- a plurality of baffle plates, as said at least one baffle plate, are vertically arranged; and
- each of the baffle plates has at least one opening permitting steam to flow therethrough; the opening of an upper one of the two adjacent vertically arranged baffle plates does not overlap the opening of a lower one.

12. The substrate processing apparatus according to claim 1, further comprising a shell surrounding the tank to restrict deformation of the tank due to internal pressure of the tank, wherein:
- elastic sealing members are held between the tubular body of the tank and the plate members, respectively; and
- the tank and the shell are configured such that the shell presses the plate members against the tubular body and the elastic sealing members are compressed to seal gaps between the tubular body and the plate members in an airtight and liquid-tight fashion when the tank is placed in the shell.

13. The substrate processing apparatus according to claim 12, wherein the tank and the shell are sized so that the plate members may not be in direct contact with the tubular body when the tank is place in the shell and component members of the tank are joined in an airtight and liquid-tight fashion.

14. The substrate processing apparatus according to claim 1, wherein an interior space of the tank has a shape of a cylinder in general having a horizontal center axis.

15. The substrate processing apparatus according to claim 14, wherein the cylinder is sized such that a bottom of the cylinder corresponding to a side of the tank has a diameter greater than a height of the cylinder corresponding to a horizontal width of the tank.

16. The substrate processing apparatus according to claim 1, further comprising an ozone generator adapted to generate ozone gas, wherein a mixed process fluid containing steam generated by the steam generator and ozone gas generated by the ozone generator is supplied into the processing vessel to process a substrate held in the processing vessel.

* * * * *